(12) United States Patent
Lin et al.

(10) Patent No.: US 11,515,441 B2
(45) Date of Patent: Nov. 29, 2022

(54) SOLAR CELLS HAVING JUNCTIONS RETRACTED FROM CLEAVED EDGES

(71) Applicant: SunPower Corporation, San Jose, CA (US)

(72) Inventors: Yafu Lin, San Jose, CA (US); David Jacob, San Francisco, CA (US)

(73) Assignee: SunPower Corporation, San Jose, CA (US)

( * ) Notice: Subject to any disclaimer, the term of this patent is extended or adjusted under 35 U.S.C. 154(b) by 12 days.

(21) Appl. No.: 16/381,482

(22) Filed: Apr. 11, 2019

(65) Prior Publication Data

US 2019/0319144 A1   Oct. 17, 2019

Related U.S. Application Data

(60) Provisional application No. 62/658,443, filed on Apr. 16, 2018.

(51) Int. Cl.
| | |
|---|---|
| *H01L 31/0352* | (2006.01) |
| *H01L 31/0216* | (2014.01) |
| *H01L 31/047* | (2014.01) |
| *H01L 31/028* | (2006.01) |
| *H01L 31/068* | (2012.01) |
| *H01L 31/18* | (2006.01) |

(52) U.S. Cl.
CPC ......... *H01L 31/047* (2014.12); *H01L 31/028* (2013.01); *H01L 31/02167* (2013.01); *H01L 31/0352* (2013.01); *H01L 31/0682* (2013.01); *H01L 31/1868* (2013.01)

(58) Field of Classification Search
CPC ......... H01L 31/0224; H01L 31/022425; H01L 31/0216; H01L 31/02167; H01L 31/0352; H01L 31/068
See application file for complete search history.

(56) References Cited

U.S. PATENT DOCUMENTS

| | | | |
|---|---|---|---|
| 5,397,400 A * | 3/1995 | Matsuno | ............. H01L 31/1804 136/256 |
| 6,333,457 B1 | 12/2001 | Mulligan et al. | |
| 6,350,661 B2 | 2/2002 | Lim et al. | |

(Continued)

FOREIGN PATENT DOCUMENTS

| | | |
|---|---|---|
| EP | EP 3149775 | 4/2017 |
| KR | 1020130119569 A | 11/2013 |

(Continued)

OTHER PUBLICATIONS

Definition of "recess" from Merriam Webster retrieved from https://www.merriam-webster.com/dictionary/recess on Jan. 27, 2021.*

(Continued)

*Primary Examiner* — Christina Chern
(74) *Attorney, Agent, or Firm* — Schwabe, Williamson & Wyatt, P.C.

(57) ABSTRACT

Methods of fabricating solar cells having junctions retracted from cleaved edges, and the resulting solar cells, are described. In an example, a solar cell includes a substrate having a light-receiving surface, a back surface, and sidewalls. An emitter region is in the substrate at the light-receiving surface of the substrate. The emitter region has sidewalls laterally retracted from the sidewalls of the substrate. A passivation layer is on the sidewalls of the emitter region.

13 Claims, 21 Drawing Sheets

(56) References Cited

U.S. PATENT DOCUMENTS

| | | | |
|---|---|---|---|
| 8,975,717 B2 | 3/2015 | Smith | |
| 2009/0260681 A1* | 10/2009 | Yun | H01L 31/02168 |
| | | | 257/E31.127 |
| 2011/0100459 A1* | 5/2011 | Yoon | H01L 31/068 |
| | | | 136/259 |
| 2012/0264252 A1 | 10/2012 | Ko et al. | |
| 2013/0153025 A1 | 6/2013 | Hahn et al. | |
| 2015/0083183 A1* | 3/2015 | Nishimoto | H01L 31/0224 |
| | | | 136/244 |
| 2016/0133779 A1* | 5/2016 | Adachi | H01L 31/022425 |
| | | | 438/66 |

FOREIGN PATENT DOCUMENTS

| | | | |
|---|---|---|---|
| KR | 1020160017931 A | 2/2016 | |
| KR | 101846445 B1 | 4/2018 | |

OTHER PUBLICATIONS

Wohrle, et al., The Speer Solar Cell—Simulation Study of Shingled Bifacial PERC-Technology-Based Stripe Cells, Presented at the 33rd European PV Solar Energy Conference and Exhibition, Sep. 25-29, 2017, Amsterdam, Netherlands, 5 pgs.

Klasen, et al., Shingled Cell Interconnection: Aiming for a Nev/ Generation of Bifacial PV-Modules, $7^{th}$ Workshop on Metallization and Interconnection, Oct. 24, 2017, 36 pgs.

International Search Report and Written Opinion from PCT/US2019/027005 dated Aug. 5, 2019, 10 pgs.

International Preliminary Reporton Patentability from PCT/US/2019/027005 dated Oct. 29, 2020, 7 pgs.

Extended European Search Report from European Patent Application No. 19788027.1 dated Apr. 16, 2021, 9 pgs.

\* cited by examiner

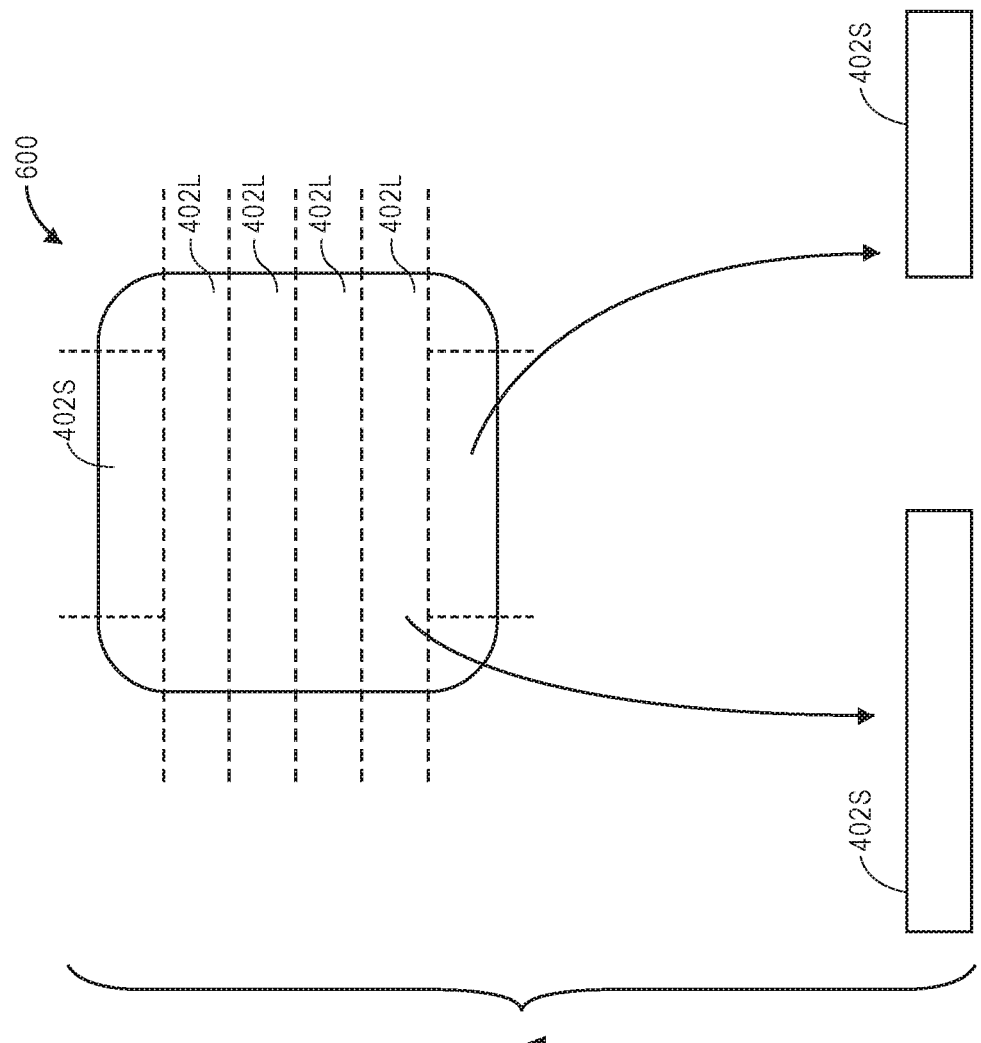

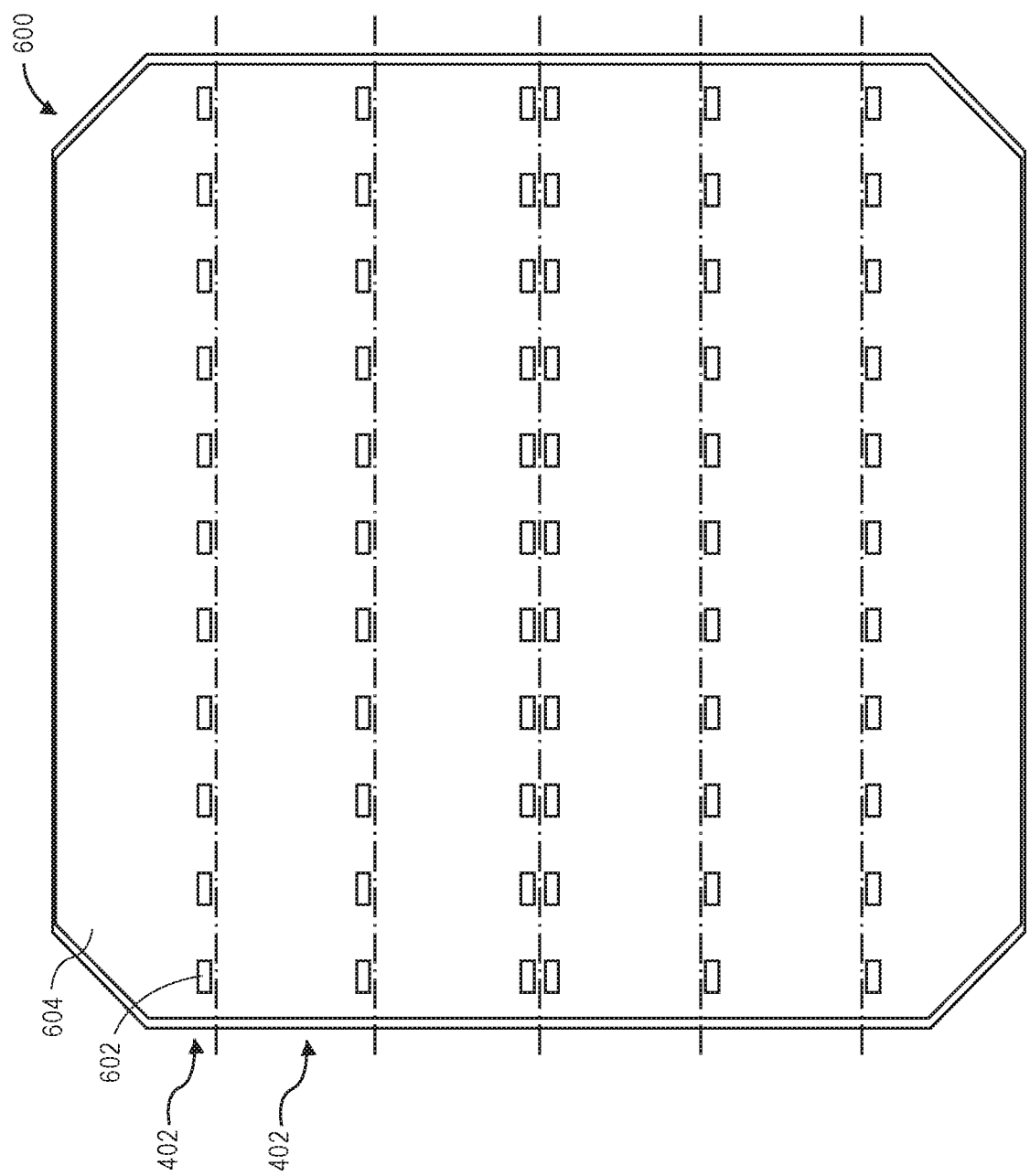

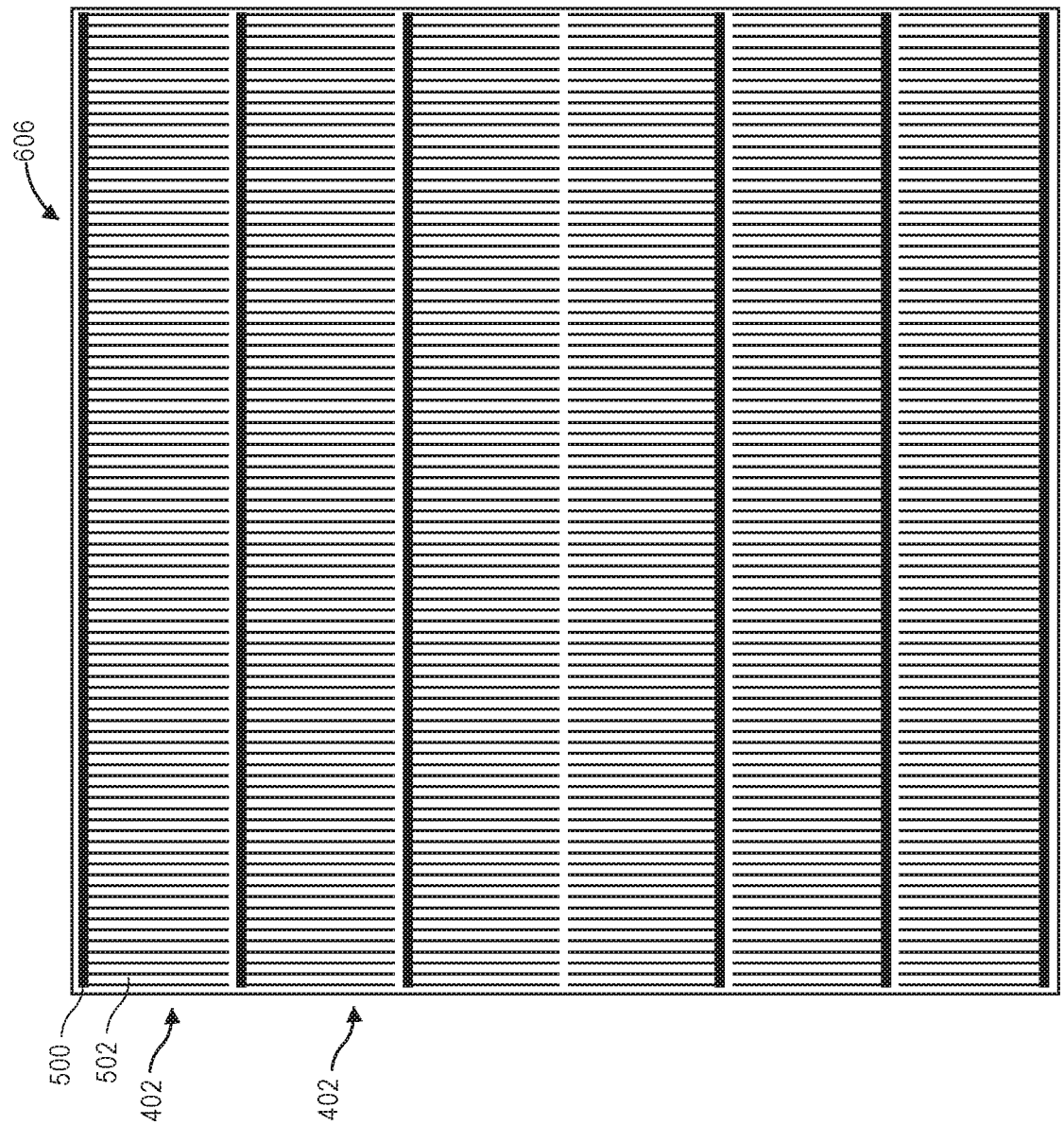

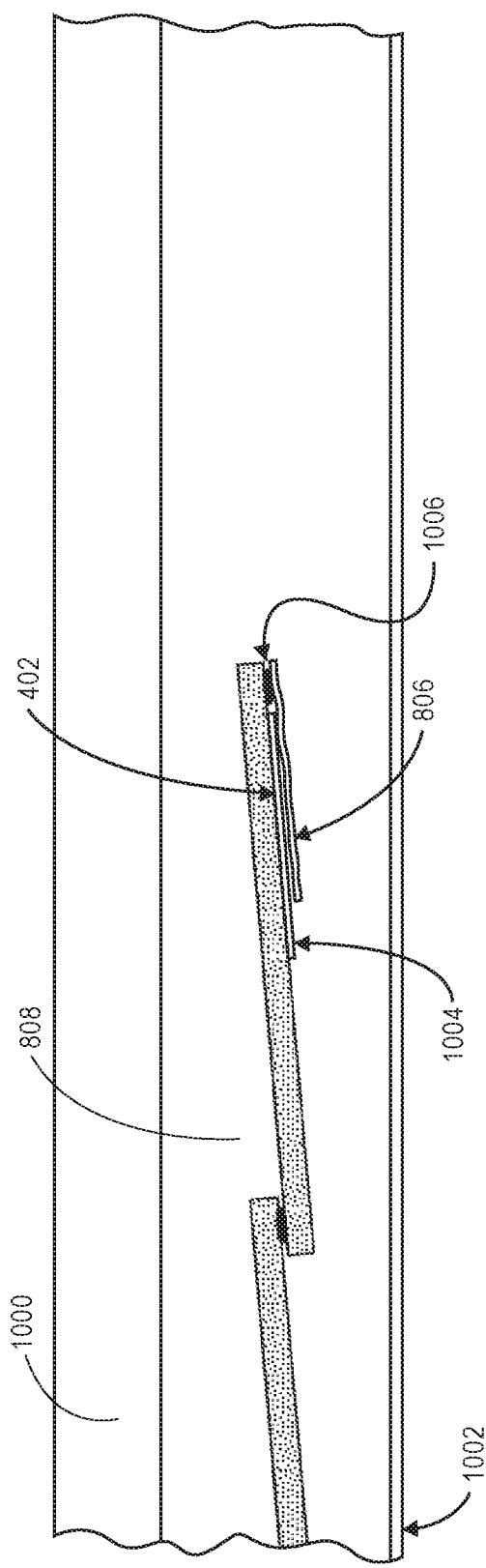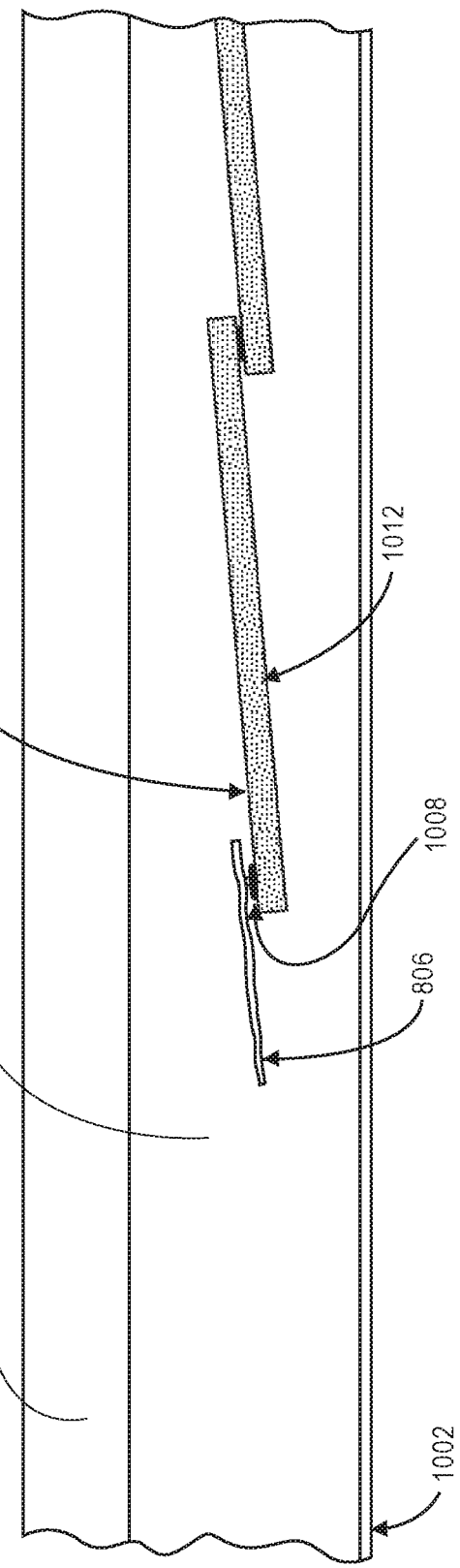

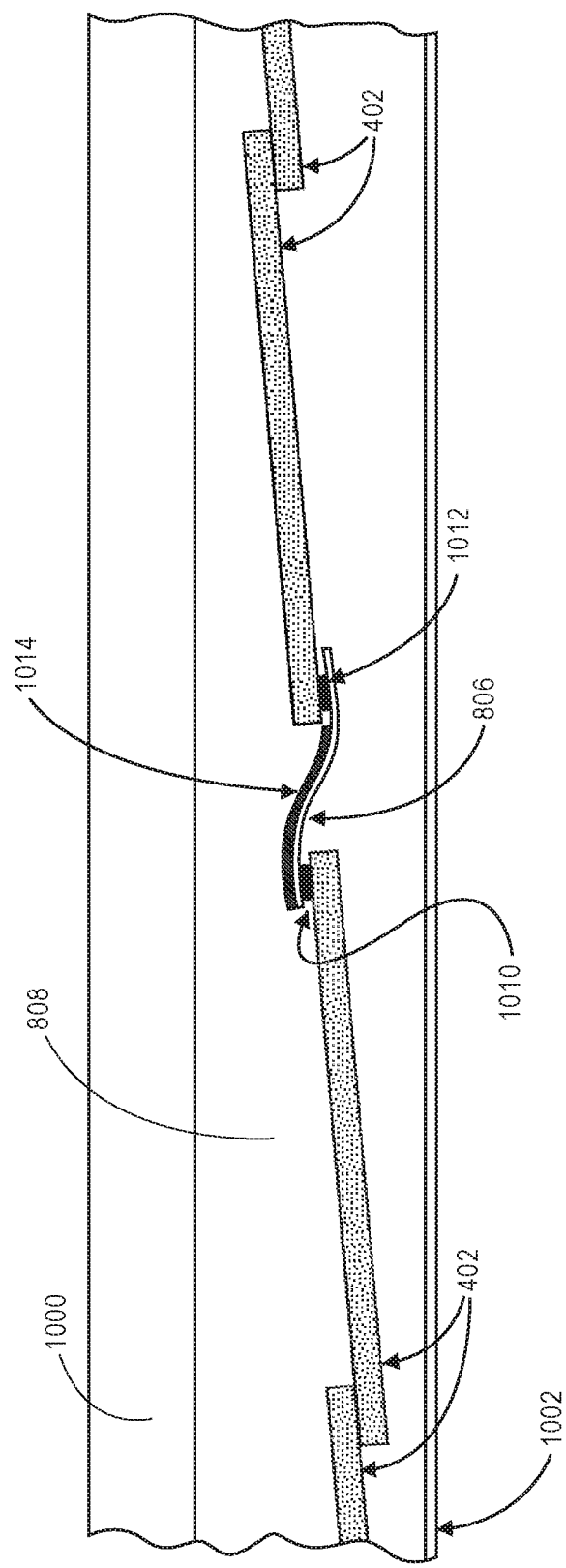

SOLAR CELLS HAVING JUNCTIONS RETRACTED FROM CLEAVED EDGES

CROSS-REFERENCE TO RELATED APPLICATIONS

This application claims the right of priority and benefit of the earlier filing date of U.S. Provisional Application No. 62/658,443, filed on Apr. 16, 2018, the entire contents of which are hereby incorporated by reference herein in its entirety.

TECHNICAL FIELD

Embodiments of the present disclosure are in the field of renewable energy and, in particular, methods of fabricating solar cells having junctions retracted from cleaved edges, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Electrical conversion efficiency is an important characteristic of a solar cell as it is directly related to the capability of the solar cell to generate power; with higher efficiency providing additional value to the end customer; and, with all other things equal, higher efficiency also reduces manufacturing cost per Watt. Likewise, simplified manufacturing approaches provide an opportunity for lower manufacturing costs by reducing the cost per unit produced. Accordingly, techniques for increasing the efficiency of solar cells and techniques for simplified manufacturing of solar cells are generally desirable. Some embodiments of the present disclosure allow for increased solar cell conversion efficiency and/or lower manufacturing costs by providing novel processes for fabricating solar cell structures. Some embodiments of the present disclosure allow for increased solar cell efficiency and/or lower manufacturing costs by providing novel solar cell structures.

BRIEF DESCRIPTION OF THE DRAWINGS

FIG. 6A is a diagram illustrating an example method by which a standard size and shape pseudo square silicon solar cell can be separated (e.g., cut, or broken) into rectangular solar cells of two different lengths that can be used to form shingled super cell, in accordance with another embodiment of the present disclosure.

FIGS. 6B and 6C illustrate diagrams illustrating another example method by which a pseudo square silicon solar cell can be separated into rectangular solar cells, in accordance with an embodiment of the present disclosure.

FIGS. 6D and 6E illustrate diagrams illustrating an example method by which a square silicon solar cell can be separated into rectangular solar cells, in accordance with an embodiment of the present disclosure.

FIG. 10A illustrates Detail A from FIG. 8D: a cross-sectional view of the example solar module of FIG. 8D illustrating cross-sectional details of flexible electrical interconnects bonded to the back surface terminal contacts of the rows of super cells, in accordance with an embodiment of the present disclosure.

FIG. 10B illustrates Detail C from FIG. 8D: a cross-sectional view of the example solar module of FIG. 8D illustrating cross-sectional details of flexible electrical interconnects bonded to the front (sunny side) surface terminal contacts of the rows of super cells, in accordance with an embodiment of the present disclosure.

FIG. 10C illustrates Detail B from FIG. 8D: a cross-sectional view of the example solar module of FIG. 8D illustrating cross-sectional details of flexible interconnects arranged to interconnect two super cells in a row in series, in accordance with an embodiment of the present disclosure.

DETAILED DESCRIPTION

Figure 1:
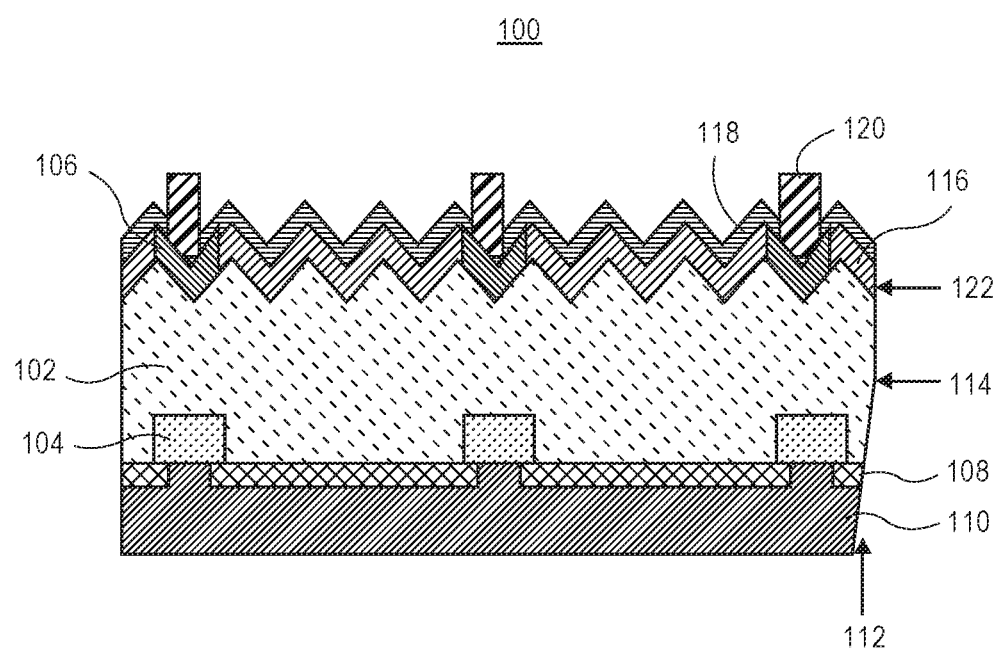
FIG. 1 illustrates a cross-sectional view of a solar cell having an emitter region with an unprotected edge.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following

DETAILED DESCRIPTION

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

As used herein, "regions" or "portions" can be used to describe discrete areas, volumes, divisions or locations of an object or material having definable characteristics but not always fixed boundaries.

"Comprising." This term is open-ended. As used in the appended claims, this term does not foreclose additional structure or steps.

"Configured To." Various units or components can be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import.

"Inhibit"—As used herein, inhibit is used to describe a reducing or minimizing effect. When a component or feature is described as inhibiting an action, motion, or condition it can completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Methods of fabricating solar cells having junctions retracted from cleaved edges, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure can be practiced without these specific details. In other instances, well-known fabrication techniques, such as lithography and patterning techniques, are not described in detail in order to not unnecessarily obscure embodiments of the present disclosure. Furthermore, it is to be appreciated that the various embodiments shown in the figures are illustrative representations and are not necessarily drawn to scale.

Disclosed herein are solar cells. In an embodiment, a solar cell includes a substrate having a light-receiving surface, a back surface, and sidewalls. An emitter region is in the substrate at the light-receiving surface of the substrate. The emitter region has sidewalls laterally retracted from the sidewalls of the substrate. A passivation layer is on the sidewalls of the emitter region.

Also disclosed herein are methods of fabricating solar cells. In one embodiment, a method of fabricating a solar cell includes forming an emitter region in a substrate, at a light-receiving surface of the substrate. A separation region, or trench, is formed in the emitter region. A passivation layer is formed on the light-receiving surface of the substrate and in the trench. The substrate is cleaved to form a solar cell having sidewalls and an emitter region having sidewalls laterally retracted from the sidewalls of the solar cell.

One or more embodiments described herein are directed to low-cost industrial solutions for separating solar cell junctions from cleave edges. Embodiments can be implemented for fabricating shingled cell. Approaches described herein can be implemented for front contact solar cell fabrication or for back contact solar cell fabrication that dice and break cells into smaller cells for module assembly such as half-cut cell modules.

To provide context, a solar cell string can be fabricated by cleaving cells (such as P-type cells) and then shingling the cleaved cells together to form the string. In the process, non-passivated cleave edges and exposed junctions can be formed. Such non-passivated cleave edges and/or exposed junctions can result in 2-3% initial power loss and lower low-light performance.

In accordance with one or more embodiments of the present disclosure, an industrially feasible approach for creating a passivated separation region or trench that isolates a front junction edge away from a cleave bared silicon edge is described. A subsequent silicon thermal oxidation plasma enhanced chemical vapor deposition of silicon nitride can then be implemented to passivate the trench and the junction edges. In an embodiment, leakage current on the exposed junction is significantly reduced, resulting in improved efficiency and low-light performance.

To provide further context, a shingling process can exhibit about 10% relatively efficiency improvement potential, as compared with a high efficiency module process using the same cells. However, in actuality, such shingled cells may only gain about 6-7% relatively efficiency, which is understood as being due to power loss from the cleaved edges. It is to be appreciated that there can be two main issues with respect to the cleaved edges: (1) exposed junctions, and (2) non-passivated bare silicon edges which can be accompanied by some laser damage. Not to be bound by theory, it is understood that an exposed junction contributes about two thirds of the loss while the second issue contributes about one third of the loss. Embodiments described herein can be viewed as primarily address issue (1), which can be critical for low-light performance.

To provide illustrative context, FIG. 1 illustrates a cross-sectional view of a solar cell having an emitter region with an unprotected edge.

Referring to FIG. 1, a solar cell 100 includes a p-type substrate 102 having a light-receiving surface, a back surface, and sidewalls. A light doped emitter region 116 is in the substrate 102 at the light-receiving surface of the substrate 102. The emitter region 116 has sidewalls in alignment with (or flush with) the sidewalls of the substrate 102. A passivation layer 118 is on the light-receiving surface of the substrate.

Referring again to FIG. 1, conductive contacts 120 are electrically connected to regions 106 of heavy dopants of n-type conductivity within the emitter region 116. The above case is selective emitter approach. For the homogeneous emitter, both 116 and 106 have the same doping. The conductive contacts 120 are formed by screen printing of Ag pastes and firing through the passivation layer 118 in a furnace to form electrical contacts. The solar cell 100 further includes regions 104 of p-type dopants at the back surface of the substrate 102. A conductive contact 110 is electrically connected to the regions 104 of p-type dopants at the back surface of the substrate 102, e.g., through openings in a bottom passivation and capping layer 108 such as AlOx/SiNy. Region 110 is screen printed Al Paste and the paste reacts with silicon in 102 region to form a p-type doping region 104.

Referring again to FIG. 1, sidewalls of solar cell 100 can include one or more of a laser cut edge 112, a non-passivated edge 114, and an exposed junction 122. Embodiments of the present disclosure can be implemented to resolve issues associated with the exposed junction 122. Implementations can involve improvements in cell efficiency and low-light performance and can be relatively low-cost.

It is to be appreciated that shingled solar cell stringing can include selective emitter processing. Embodiments described herein can introduce an additional process operation to open a solid state doping layer, such as a phosphorous silicate glass (PSG) layer, in a same operation used for selective emitter fabrication by doping with the PSG layer. Opening the solid state doping layer enables removal of a portion of the formed emitter region by using a laser ablation or screen print or inkjet of etch paste patterning operation. The removed portion of the emitter region can then be passivated in subsequent process operations, such as by formation of a passivation layer. The passivation layer can be a passivating material or insulation material such as, but not limited to, SiOx, SiNx, TiOx, combinations thereof, a single layer anti-reflective coating (ARC), or a multilayer ARC. During a subsequent laser dicing and cleaving process to form shingles, the cleave performed needs to be within or proximate to the trench defined region. In one embodiment, a full separation region or full trench approach is used. In another embodiment, a partial separation region or partial trench approach is used.

Figure 2A:
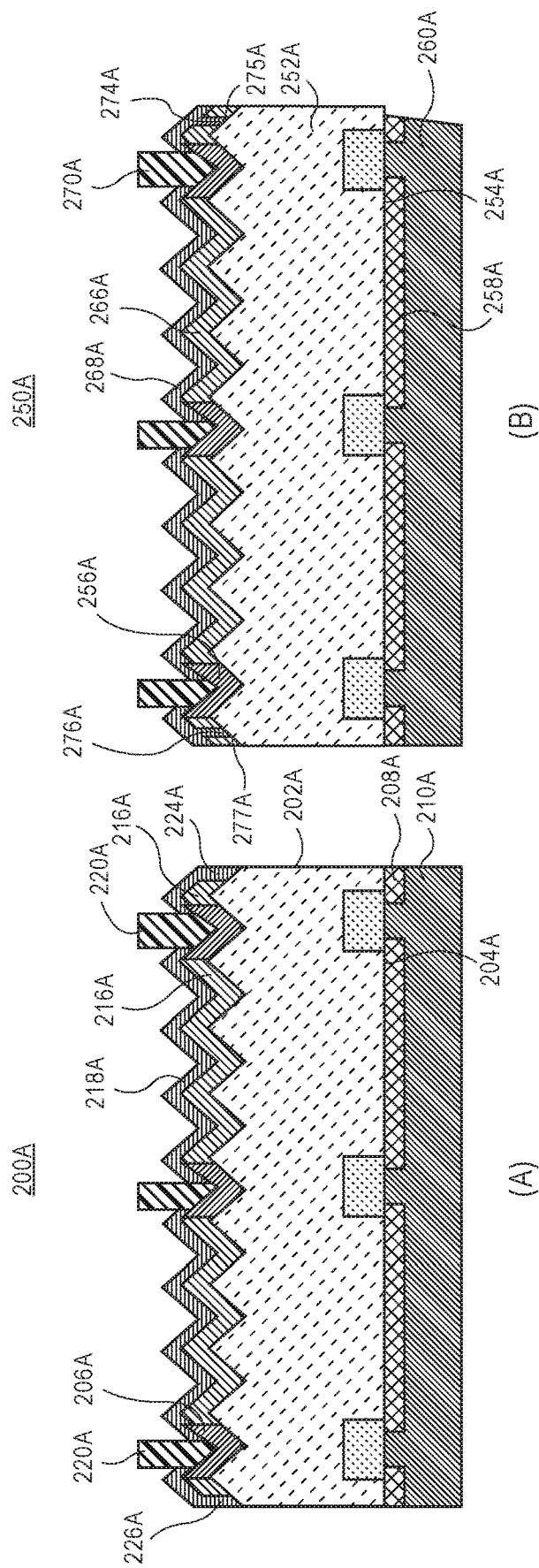
FIG. 2A illustrates cross-sectional views of solar cells having an emitter region with a retracted and protected edge, in accordance with an embodiment of the present disclosure.

As an example of solar cells having passivated junctions, FIG. 2A illustrates cross-sectional views of solar cells having an emitter region with a retracted and protected edge, in accordance with an embodiment of the present disclosure.

Referring to part (A) of FIG. 2A, a solar cell 200A includes a substrate 202A having a light-receiving surface, a back surface, and sidewalls. An emitter region 216A is in the substrate 202A at the light-receiving surface of the substrate 202A. The emitter region 216A has sidewalls laterally retracted from the sidewalls of the substrate 202A. A passivation layer 224A/226A is on the sidewalls of the emitter region 216A. In accordance with one embodiment, the passivation layer 224A/226A is in a corresponding recess between a corresponding sidewall of the emitter region 216A and a corresponding sidewall of the substrate 202A, as is depicted. In one such embodiment, a corresponding edge of the passivation layer 224A/226A is vertically aligned with the corresponding sidewall of the substrate 202A, as is depicted.

Referring to part (B) of FIG. 2A, a solar cell 250A includes a substrate 252A having a light-receiving surface, a back surface, and sidewalls. An emitter region 266A is in the substrate 252A at the light-receiving surface of the substrate 252A. The emitter region 266A has sidewalls laterally retracted from the sidewalls of the substrate 252A. A passivation layer 274A/276A is on the sidewalls of the emitter region 266A. In accordance with one embodiment, the passivation layer 274A/276A is in a corresponding trench between a corresponding sidewall of the emitter region 266A and a corresponding sidewall of the substrate 252A, as is depicted. In one such embodiment, isolated emitter regions portions 275A/277A remain laterally adjacent to the passivation layer 274A/276A at an outer periphery of the solar cell 250A, as is depicted.

Referring to both parts (A) and (B) of FIG. 2A, a passivation layer 218A or 268A is on the light-receiving surface of the substrate 202A or 252A, respectively. The passivation layer 224A/226A or 274A/276A on the sidewalls of the emitter region 216A or 266A, respectively, is continuous with the passivation layer 218A or 268A, respectively, on the light-receiving surface of the substrate 202A or 252A, respectively. In one embodiment, the passivation layer 216A/224A/226A or 266A/274A/276A includes silicon oxide (SiOx) or silicon nitride (SiNx), or a combination of a layer of silicon oxide (SiOx) and a layer of silicon nitride (SiNx).

Referring again to both parts (A) and (B) of FIG. 2A, in an embodiment, the emitter region 216A or 266A includes a concentration of dopants of a conductivity type, and the solar cell further includes regions 206A or 256A, respectively, of dopants of the conductivity type within the emitter region 216A or 266A, respectively. In one embodiment, the regions 206A or 256A of dopants of the conductivity type have a higher concentration of dopants of the conductivity type than the concentration of dopants of the conductivity type of the emitter region 216A or 266A, respectively. In an embodiment, the conductivity type is n-type, and the dopants are selected from the group consisting of phosphorous dopants and arsenic dopants.

Referring again to both parts (A) and (B) of FIG. 2A, conductive contacts 220A or 270A are electrically connected to the regions 206A or 256A, respectively, of dopants of the conductivity type within the emitter region 216A or 266A, respectively. In one such embodiment, the conductive contacts 220A or 270A are formed by screen printing of Ag pastes and firing through the passivation layer 218A or 268A, respectively, on the light-receiving surface of the substrate 202A or 252A, respectively, as is depicted.

In an embodiment, the conductive contacts 220A or 270A include silver. In one such embodiment, the conductive contacts 220A or 270A are formed using a conductive paste, such as a silver based conductive paste. In a specific such embodiment, the conductive paste includes silver (Ag) powder and a solvent or a resin. In one embodiment, the conductive paste further includes a glass frit. In another embodiment, the conductive paste does not include a glass frit. In either case, in an embodiment, the silver paste can be fired or sintered on the passivation layer 218A or 268A, respectively, to form the conductive contacts 220A or 270A, respectively.

Referring again to both parts (A) and (B) of FIG. 2A, in an embodiment, the substrate 202A or 252A is a p-type monocrystalline silicon substrate. In one embodiment, the light-receiving surface of the substrate 202A or 252A is texturized to provide a texturized light-receiving surface. In a specific embodiment, a hydroxide-based wet etchant is employed to texturize the light receiving surfaces of the substrates 202A or 252A.

Referring again to both parts (A) and (B) of FIG. 2A, in an embodiment, the emitter region 216A or 266A includes n-type dopants, and the solar cell 200A or 250A, respectively, further includes regions 204A or 254A, respectively, of heavier doped p-type dopants at the back surface of the substrate 202A or 252A, respectively. In one embodiment, the p-type dopants are aluminum dopants or boron dopants from next generation of pastes.

Referring again to both parts (A) and (B) of FIG. 2A, a conductive contact 210A or 260A is electrically connected to the regions 204A or 254A, respectively, of p-type dopants at the back surface of the substrate 202A or 252A, respectively. In one embodiment, the conductive contact 210A or 260A is screen printed and fired Al, but may not be so limited. The conductive contact 210A or 260A is formed by screen printed and fired Al paste through openings in a bottom passivation and capping layers 208A or 258A, respectively, on the back surface of the substrate 202A or 252A, respectively. In one embodiment, the bottom passivation and capping layer 208A or 258A is a silicon nitride layer or an amorphous silicon layer.

Thus, referring again to both parts (A) and (B) of FIG. 2A, in accordance with one or more embodiments of the present disclosure, isolation trench schemes include fabrication of a full trench or of a partial trench, where the latter can be associated with faster processing times. It is to be appreciated that in either scheme, metal can be kept away from the trench to avoid shunting.

Figure 2B:
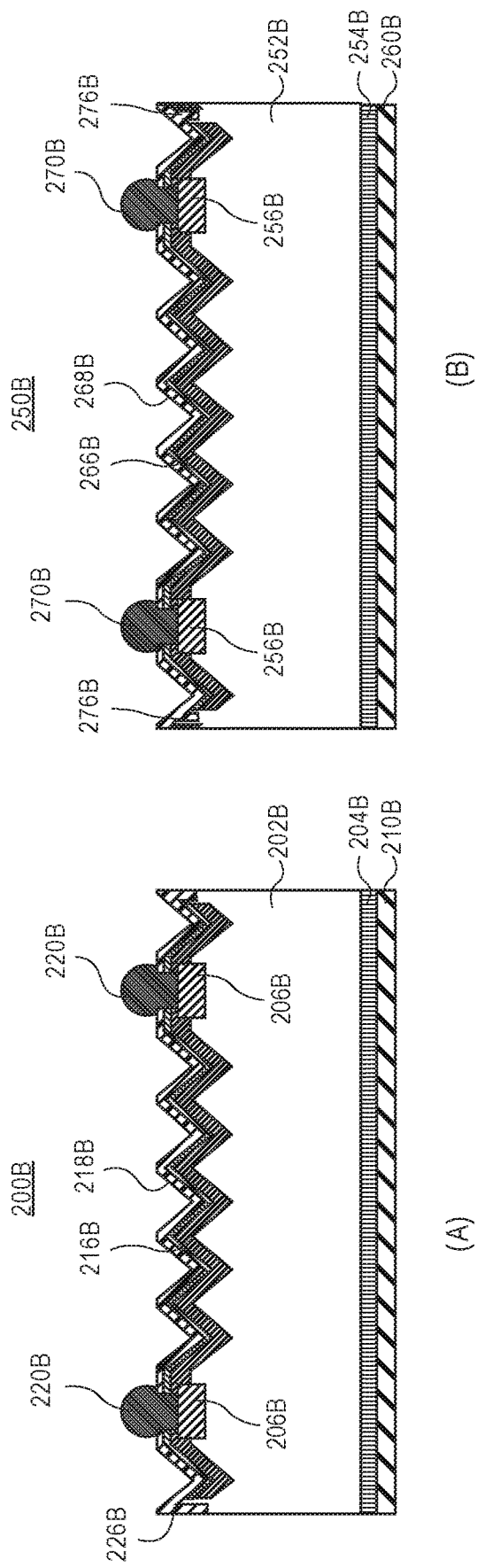
FIG. 2B illustrates cross-sectional views of solar cells having an emitter region with a retracted and protected edge, in accordance with another embodiment of the present disclosure.

As another example of solar cells having passivated junctions, FIG. 2B illustrates cross-sectional views of solar cells having an emitter region with a retracted and protected edge, in accordance with another embodiment of the present disclosure.

Referring to part (A) of FIG. 2B, a solar cell 200B includes a substrate 202B having a light-receiving surface, a back surface, and sidewalls. An emitter region 216B is on the substrate 202B at the light-receiving surface of the substrate 202B. The emitter region 216B has sidewalls laterally retracted from the sidewalls of the substrate 202B. A passivation layer 226B is on the sidewalls of the emitter region 216B. In accordance with one embodiment, the passivation layer 226B is in a corresponding recess between a corresponding sidewall of the emitter region 216B and a corresponding sidewall of the substrate 202B, as is depicted. In one such embodiment, a corresponding edge of the passivation layer 226B is vertically aligned with the corresponding sidewall of the substrate 202B, as is depicted.

Referring to part (B) of FIG. 2B, a solar cell 250B includes a substrate 252B having a light-receiving surface, a back surface, and sidewalls. An emitter region 266B is on the substrate 252B at the light-receiving surface of the substrate 252B. The emitter region 266B has sidewalls laterally retracted from the sidewalls of the substrate 252B. A passivation layer 276B is on the sidewalls of the emitter region 266B. In accordance with one embodiment, the passivation layer 276B is in a corresponding trench between a corresponding sidewall of the emitter region 266B and a corresponding sidewall of the substrate 252B, as is depicted. In one such embodiment, isolated emitter regions portions remain laterally adjacent to the passivation layer 276B at an outer periphery of the solar cell 250B, as is depicted.

Referring to both parts (A) and (B) of FIG. 2B, a passivation layer 218B or 268B is on the light-receiving surface of the substrate 202B or 252B, respectively. The passivation layer 226B or 276B on the sidewalls of the emitter region 216B or 266B, respectively, is continuous with the passivation layer 218B or 268B, respectively, on the light-receiving surface of the substrate 202B or 252B, respectively. In one embodiment, the passivation layer 216B/226B or 266B/276B includes silicon oxide (SiOx) or silicon nitride (SiNx) or aluminum oxide (AlOx), or a combination of two or more of a layer of silicon oxide (SiOx), a layer of silicon nitride (SiNx), and/or a layer of aluminum oxide (AlOx).

Referring again to both parts (A) and (B) of FIG. 2B, conductive contacts 220B or 270B are electrically connected to regions 206B or 256B, respectively, of dopants of the conductivity type within the emitter region 216B or 266B, respectively. A conductive contact 210B or 260B is electrically connected to regions 204B or 254B, respectively, at the back surface of the substrate 202B or 252B, respectively, which can be of opposite conductivity to regions 206B and 266B.

Figure 2C:
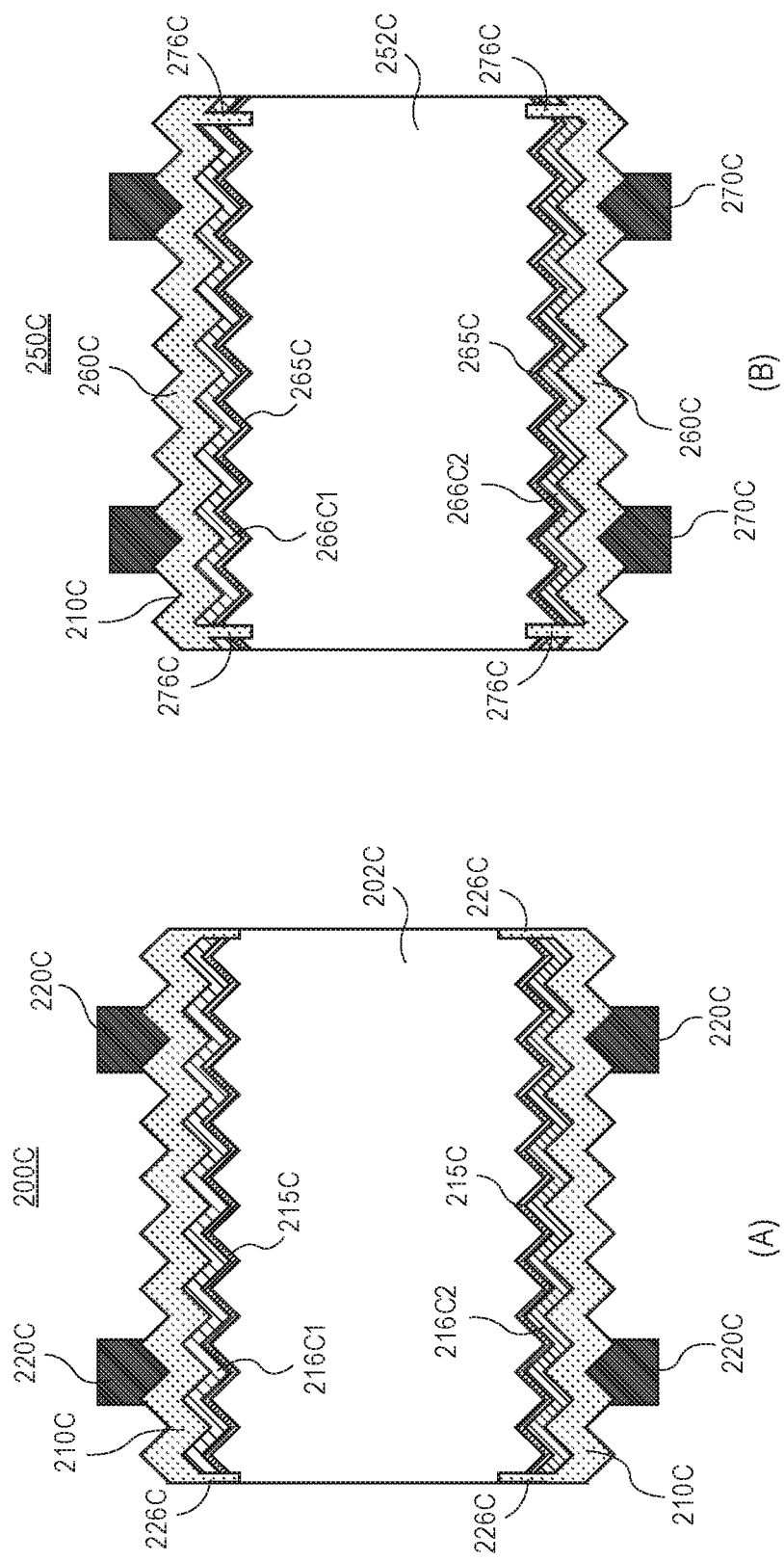
FIG. 2C illustrates cross-sectional views of solar cells having an emitter region with a retracted and protected edge, in accordance with another embodiment of the present disclosure.

As another example of solar cells having passivated junctions, FIG. 2C illustrates cross-sectional views of solar cells having an emitter region with a retracted and protected edge, in accordance with an embodiment of the present disclosure.

Referring to part (A) of FIG. 2C, a solar cell 200C includes a substrate 202C having first (e.g., top) and second (e.g., bottom) light-receiving surfaces and sidewalls. An emitter layer 216C1 is on an intrinsic layer 215C on the substrate 202C at the first light-receiving surface of the substrate 202C. The emitter region 216C1 has sidewalls laterally retracted from the sidewalls of the substrate 202C. A transparent conductive oxide layer 226C is on the sidewalls of the emitter region 216C1. In accordance with one embodiment, the transparent conductive oxide layer 226C is in a corresponding recess between a corresponding sidewall of the emitter region 216C1 and a corresponding sidewall of the substrate 202C, as is depicted. In one such embodiment, a corresponding edge of the transparent conductive oxide layer 226C is vertically aligned with the corresponding sidewall of the substrate 202C, as is depicted. Conductive contacts 220C are electrically connected to a transparent conductive oxide layer 210C on the emitter region 216C1.

Referring again to part (A) of FIG. 2C, an emitter layer 216C2 is on an intrinsic layer 215C on the substrate 202C at the second light-receiving surface of the substrate 202C. The emitter region 216C2 has a conductivity type opposite the conductivity type of the emitter region 216C1. The emitter region 216C2 has sidewalls laterally retracted from the sidewalls of the substrate 202C. A transparent conductive oxide layer 226C is on the sidewalls of the emitter region 216C2. In accordance with one embodiment, the transparent conductive oxide layer 226C is in a corresponding recess between a corresponding sidewall of the emitter region 216C2 and a corresponding sidewall of the substrate 202C, as is depicted. In one such embodiment, a corresponding edge of the transparent conductive oxide layer 226C is vertically aligned with the corresponding sidewall of the substrate 202C, as is depicted. Conductive contacts 220C are electrically connected to a transparent conductive oxide layer 210C on the emitter region 216C2.

Referring to part (B) of FIG. 2C, a solar cell 250C includes a substrate 252C having first (e.g., top) and second (e.g., bottom) light-receiving surfaces and sidewalls. An emitter layer 266C1 is on an intrinsic layer 265C on the substrate 252C at the first light-receiving surface of the substrate 252C. The emitter region 266C1 has sidewalls laterally retracted from the sidewalls of the substrate 252C. A transparent conductive oxide layer 276C is on the sidewalls of the emitter region 266C1. In accordance with one embodiment, the transparent conductive oxide layer 276C is in a corresponding trench between a corresponding sidewall of the emitter region 266C2 and a corresponding sidewall of the substrate 252C, as is depicted. In one such embodiment, isolated emitter region portions remain laterally adjacent to the transparent conductive oxide layer 276C at an outer periphery of the solar cell 250C, as is depicted. Conductive contacts 270C are electrically connected to a transparent conductive oxide layer 260C on the emitter region 266C1.

Referring again to part (B) of FIG. 2C, an emitter layer 266C2 is on an intrinsic layer 265C on the substrate 252C at the second light-receiving surface of the substrate 252C. The emitter region 266C2 has a conductivity type opposite the conductivity type of the emitter region 266C1. The emitter region 266C2 has sidewalls laterally retracted from the sidewalls of the substrate 252C. A transparent conductive oxide layer 276C is on the sidewalls of the emitter region 266C2. In accordance with one embodiment, the transparent conductive oxide layer 276C is in a corresponding trench between a corresponding sidewall of the emitter region 266C2 and a corresponding sidewall of the substrate 252C, as is depicted. In one such embodiment, isolated emitter region portions remain laterally adjacent to the transparent conductive oxide layer 276C at an outer periphery of the solar cell 250C, as is depicted. Conductive contacts 270C are electrically connected to a transparent conductive oxide layer 260C on the emitter region 266C2.

Figure 3:
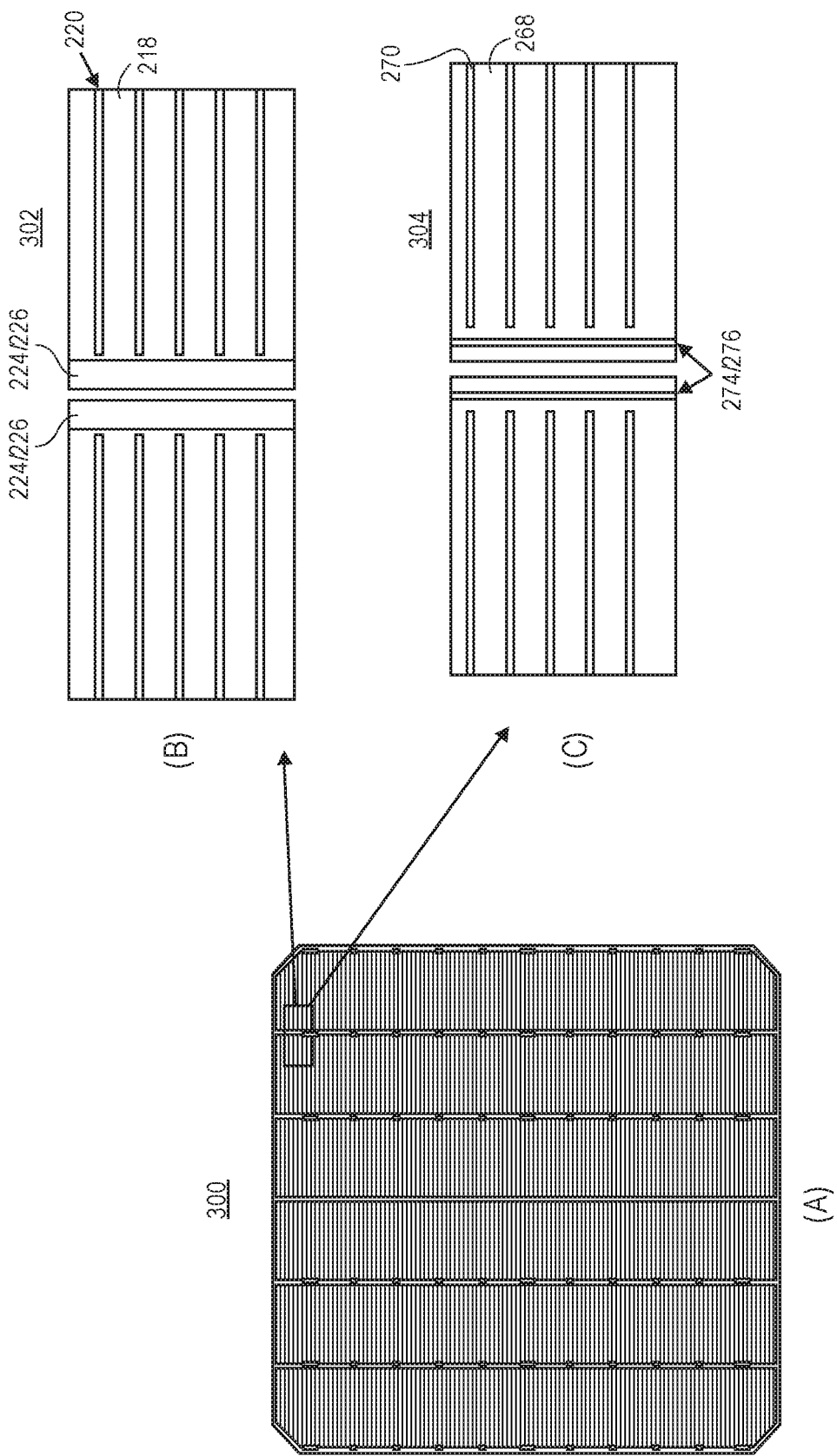
FIG. 3 illustrates plan views of the formation of solar cells having an emitter region with a retracted and protected edge, in accordance with an embodiment of the present disclosure.

As an exemplary processing scheme, FIG. 3 illustrates plan views of the formation of solar cells having an emitter region with a laterally retracted and protected edge, in accordance with an embodiment of the present disclosure.

Referring to part (A) of FIG. 3, a method of fabricating a solar cell includes forming an emitter region in a substrate 300, at a light-receiving surface of the substrate 300. Referring to parts (B) or (C) a trench is formed in the emitter region. A passivation layer 218 or 268 is formed on the light-receiving surface of the substrate and in the trench. The substrate is cleaved to form a solar cell having sidewalls and an emitter region having sidewalls laterally retracted from the sidewalls of the solar cell.

Referring specifically to part (B) of FIG. 3, in an embodiment, cleaving the substrate involves cleaving through the passivation layer in the trench to form cells 302 each having a passivation layer 224/226 in a respective recess, as described above in association with part (A) of FIG. 2. Referring specifically to part (C) of FIG. 3, in another embodiment, cleaving the substrate involves cleaving through a portion of the emitter region laterally adjacent the trench to form cells 304 each having a passivation layer 274/276 in a respective trench, as described above in association with part (B) of FIG. 2A.

In an embodiment, forming the trench in the emitter region of the substrate 300 involves using laser ablation. In another embodiment, forming the trench in the emitter region of the substrate 300 involves using an etch paste. Overall, in accordance with one or more embodiments of the present disclosure, a laser or inkjet or screen of an etch paste is used to create an isolation trench that can also be used for fully cut or even partially cut (e.g., half cut) cells for improving low-light performance. In an embodiment, both cleaved edges are passivated even though an edge under shingling may be less critical since the diffusion length of cells are much smaller than the overlap. In other embodiments, only a single edge is passivated according to the above described process.

Figure 13:
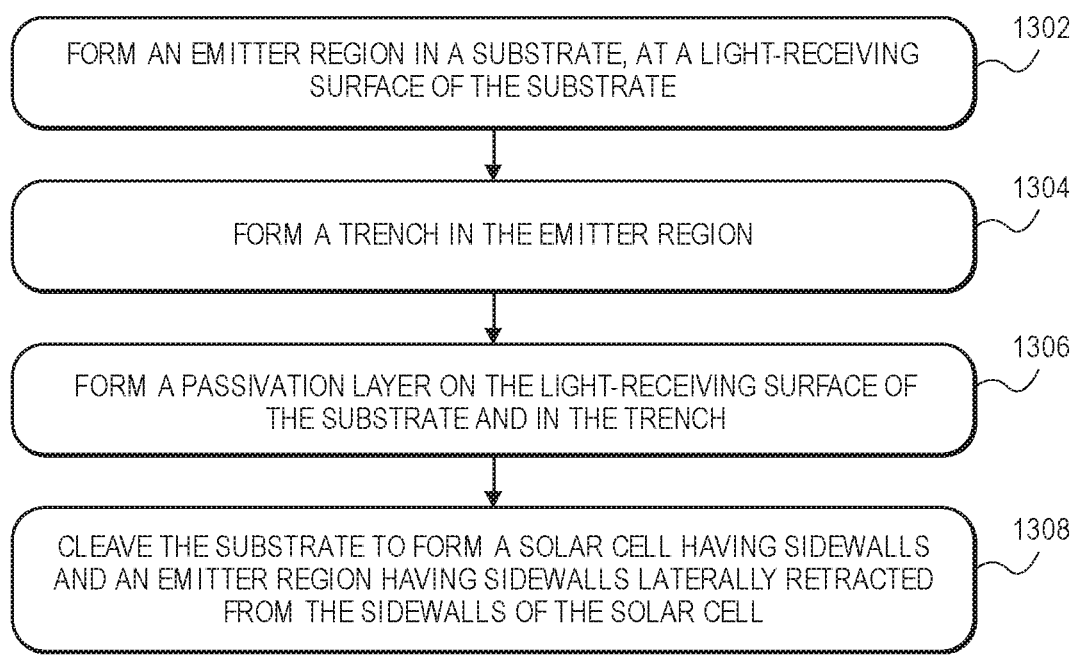
FIG. 13 is a flowchart representing various operations in a method of fabricating a solar cell, in accordance with an embodiment of the present disclosure.

FIG. 13 is a flowchart 1300 representing various operations in a method of fabricating a solar cell, in accordance with an embodiment of the present disclosure. At operation 1302, the method involves forming an emitter region in a substrate, at a light-receiving surface of the substrate. At operation 1304, the method involves forming a trench in the emitter region. At operation 1306, the method involves forming a passivation layer on the light-receiving surface of the substrate and in the trench to passivate an emitter edge. At operation 1308, the method involves cleaving the substrate to form a solar cell having sidewalls and an emitter region having sidewalls laterally retracted from the sidewalls of the solar cell. In one embodiment, a full trench approach is used. In another embodiment, a partial trench approach is used.

Figure 4:
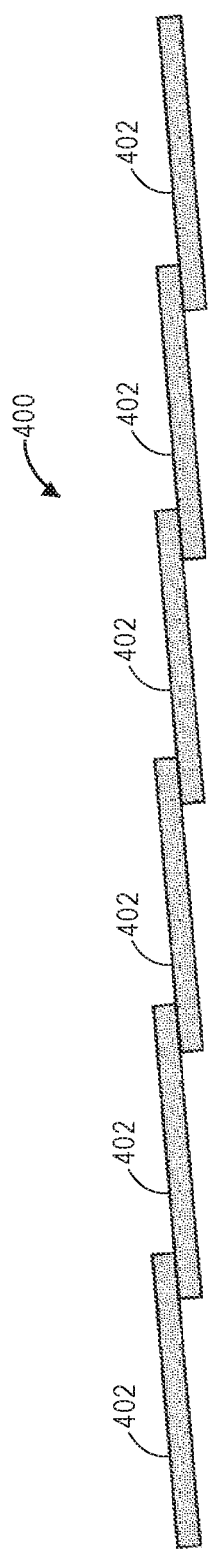
FIG. 4 illustrates a cross-sectional diagram of a string of series-connected solar cells arranged in a shingled manner with the ends of adjacent solar cells overlapping to form a shingled super cell, in accordance with an embodiment of the present disclosure.

In accordance with one or more embodiments of the present disclosure, high-efficiency shingled arrangements of silicon solar cells in solar cell modules are described herein. As an example, FIG. 4 illustrates a cross-sectional view of a string of series-connected solar cells 402 arranged in a shingled manner with the ends of adjacent solar cells overlapping and electrically connected to form a super cell 400. Each solar cell 402 includes a semiconductor diode structure and electrical contacts to the semiconductor diode structure by which electric current generated in solar cell 402 when it is illuminated by light can be provided to an external load.

In the examples described in this specification, each solar cell 402 is a crystalline silicon solar cell having front (sun side) surface and back (shaded side) surface metallization patterns providing electrical contact to opposite sides of an n-p junction, the front surface metallization pattern is disposed on a semiconductor layer of n-type conductivity, and the back surface metallization pattern is disposed on a semiconductor layer of p-type conductivity. However, any other suitable solar cells employing any other suitable material system, diode structure, physical dimensions, or electrical contact arrangement can be used instead of or in addition to solar cells 402 in the solar modules described in this specification. For example, the front (sun side) surface metallization pattern can be disposed on a semiconductor layer of p-type conductivity, and the back (shaded side) surface metallization pattern disposed on a semiconductor layer of n-type conductivity.

Referring again to FIG. 4, in super cell 400 adjacent solar cells 402 are conductively bonded to each other in the region in which they overlap by an electrically conducting bonding material that electrically connects the front surface metallization pattern of one solar cell to the back surface metallization pattern of the adjacent solar cell. Suitable electrically conducting bonding materials can include, for example, electrically conducting adhesives and electrically conducting adhesive films and adhesive tapes, and conventional solders. Preferably, the electrically conducting bonding material provides mechanical compliance in the bond between the adjacent solar cells that accommodates stress arising from mismatch between the coefficient of thermal expansion (CTE) of the electrically conducting bonding material and that of the solar cells (e.g., the CTE of silicon). To provide such mechanical compliance, in some variations the electrically conducting bonding material is selected to have a glass transition temperature of less than or equal to about 0° C. To further reduce and accommodate stress parallel to the overlapping edges of the solar cells arising from CTE mismatch, the electrically conductive bonding material can optionally be applied only at discrete locations along the overlapping regions of the solar cells rather than in a continuous line extending substantially the length of the edges of the solar cells.

The thickness of the electrically conductive bond between adjacent overlapping solar cells formed by the electrically conductive bonding material, measured perpendicularly to the front and back surfaces of the solar cells, can be for example less than about 0.1 mm. Such a thin bond reduces resistive loss at the interconnection between cells, and also promotes flow of heat along the super cell from any hot spot in the super cell that might develop during operation.

Figure 5:
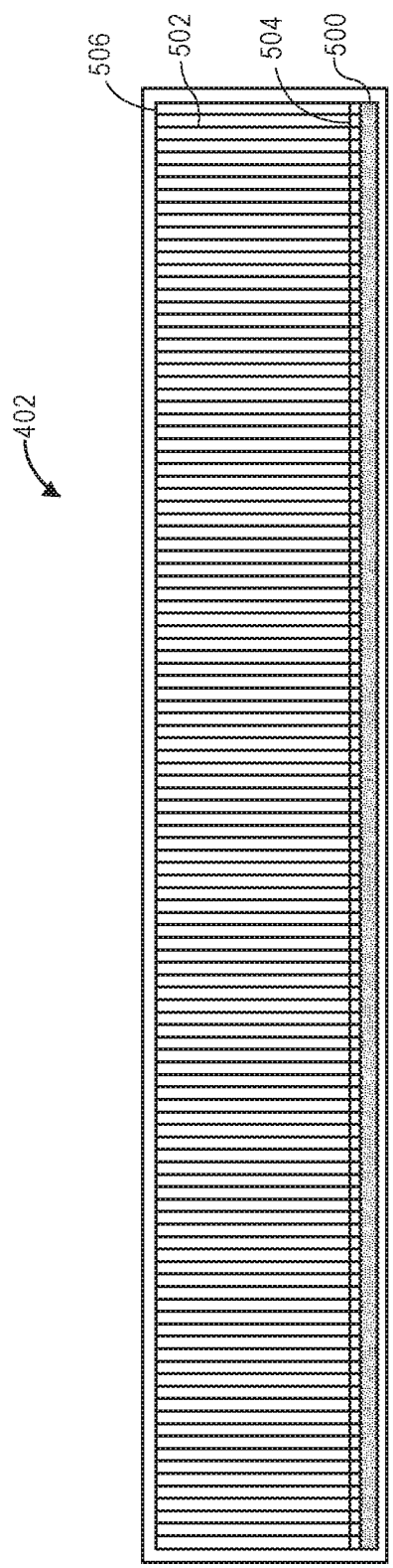
FIG. 5 is a diagram of the front (sun side) surface and front surface metallization pattern of an example rectangular solar cell that can be used to form shingled super cells, in accordance with another embodiment of the present disclosure.

FIG. 5 illustrates the front surface of an example rectangular solar cell 402 that can be used in a super cell 400. Other shapes for solar cell 402 can also be used, as suitable. That is, the solar cells 402 need not be rectangular. In the illustrated example the front surface metallization pattern of solar cell 402 includes a bus bar 500 positioned adjacent to the edge of one of the long sides of solar cell 402 and running parallel to the long sides for substantially the length of the long sides, and fingers 502 attached perpendicularly to the bus bar and running parallel to each other and to the short sides of solar cell 402 for substantially the length of the short sides.

In the example of FIG. 5, solar cell 402 has a length of about 156 mm, a width of about 26 mm, and thus an aspect ratio (length of short side/length of long side) of about 1:6. Six such solar cells can be prepared on a standard 156 mm×156 mm dimension silicon wafer, then separated (diced) to provide solar cells as illustrated. In other variations, eight solar cells 402 having dimensions of about 19.5 mm×156 mm, and thus an aspect ratio of about 1:8, can be prepared from a standard silicon wafer. More generally, solar cells 402 can have aspect ratios of, for example, about 1:2 to about 1:20 and can be prepared from standard size wafers or from wafers of any other suitable dimensions. It is to be appreciated silicon wafers larger than 156 mm×156 mm can be used, such as silicon wafers having an area of 156.75 mm×156.75 mm, 158.75 mm×158.75 mm, 161.75 mm×161.75 mm, or even larger. In other embodiments, silicon wafers smaller than 156 mm×156 mm can be used.

FIG. 6A illustrates an example method by which a standard size and shape pseudo square silicon solar cell wafer 600 can be cut, broken, or otherwise divided to form rectangular solar cells as just described. In this example, several full width rectangular solar cells are cut from the central portion of the wafer, and in addition several shorter rectangular solar cells 402S are cut from end portions of the wafer and the chamfered or rounded corners of the wafer are discarded. Solar cells can be used to form shingled super cells of one width, and solar cells 402S can be used to form shingled super cells of a narrower width.

Figure 6B:
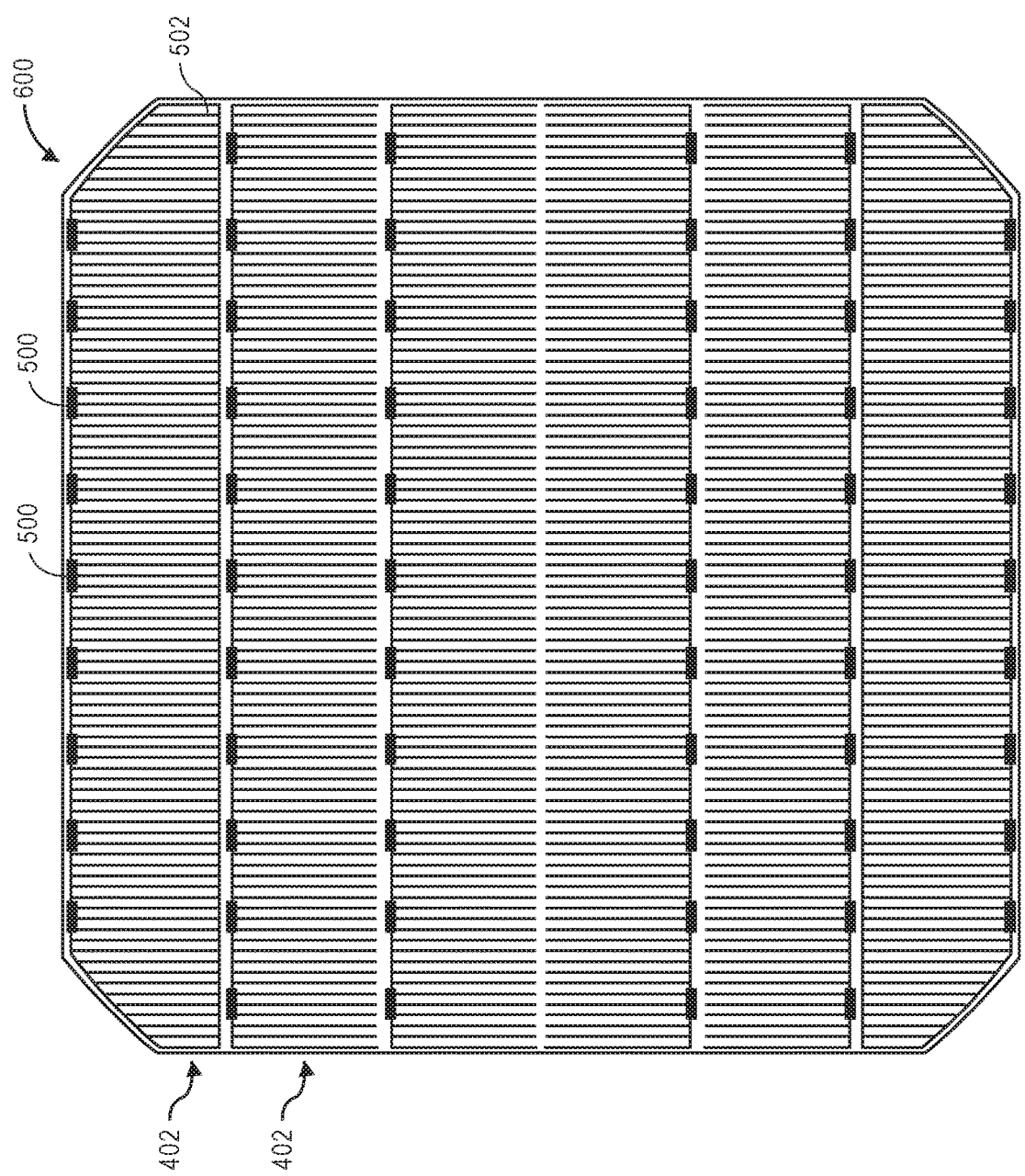

FIGS. 6B and 6C illustrate front and back views of a pseudo square wafer 600 that can be diced along the dashed lines shown in FIG. 6C to provide a plurality of solar cells 402 having front surface metallization patterns similar to that shown in FIG. 5, and two chamfered solar cells 402 having front surface metallization patterns.

In the example front surface metallization pattern shown in FIG. 6B, the two end portions of the thin conductor that interconnects discrete contact pads 500 extend around the chambered corners of the solar cell and taper with increasing distance from the long side of the solar cell along which the discrete contact pads are arranged. Such tapering is optional, but can advantageously reduce metal use and shading of the active region of the solar cell without significantly increasing resistive loss.

Figure 6E:
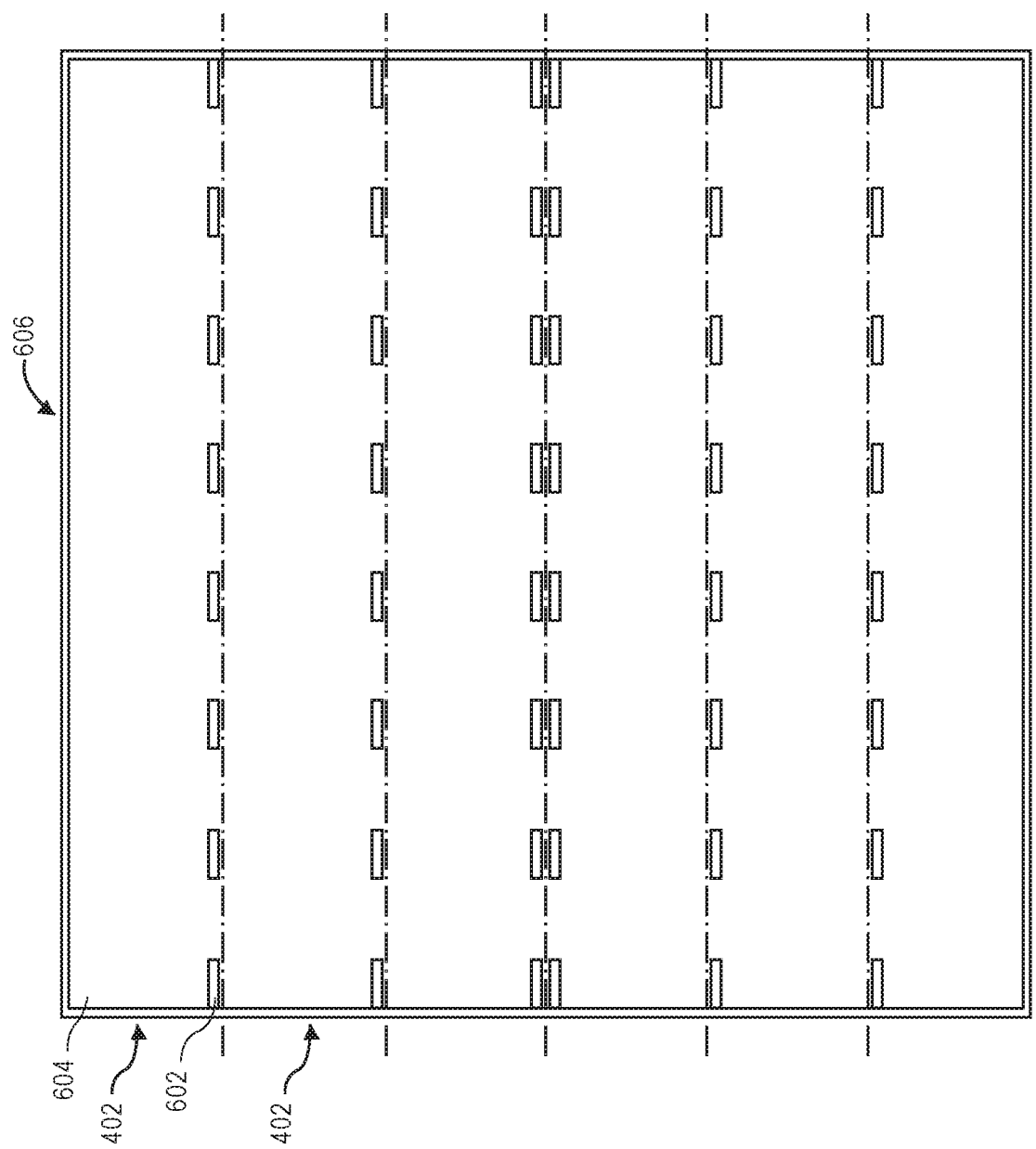

FIGS. 6D and 6E illustrate front and back views of a perfect square wafer 606 that can be diced along the dashed lines shown in FIG. 6E to provide a plurality of solar cells 402 having front surface metallization patterns similar to that shown in FIG. 5.

Chamfered rectangular solar cells can be used to form super cells including only chamfered solar cells. Additionally or alternatively, one or more such chamfered rectangular solar cells can be used in combination with one or more unchamfered rectangular solar cells (e.g., FIG. 5) to form a super cell. For example, the end solar cells of a super cell can be chamfered solar cells, and the middle solar cells unchamfered solar cells. If chamfered solar cells are used in combination with unchamfered solar cells in a super cell, or more generally in a solar module, it can be desirable to use dimensions for the solar cells that result in the chamfered and unchamfered solar cells having the same front surface area exposed to light during operation of the solar cells. Matching the solar cell areas in this manner matches the current produced in the chamfered and unchamfered solar cells, which improves the performance of a series connected string that includes both chamfered and unchamfered solar cells. The areas of chamfered and unchamfered solar cells cut from the same pseudo square wafer can be matched, for example, by adjusting locations of the lines along which the wafer is diced to make the chamfered solar cells slightly wider than the unchamfered solar cells in the direction perpendicular to their long axes, to compensate for the missing corners on the chamfered solar cells.

A solar module can include only super cells formed exclusively from unchamfered rectangular solar cells, or only super cells formed from chamfered rectangular solar cells, or only super cells that include chamfered and unchamfered solar cells, or any combination of these three variations of super cell.

In some instances portions of a standard size square or pseudo square solar cell wafer (e.g., wafer 600 or wafer 606) near the edges of the wafer can convert light to electricity with lower efficiency than portions of the wafer located away from the edges. To improve the efficiency of the resulting rectangular solar cells, in some variations one or more edges of the wafer are trimmed to remove the lower efficiency portions before the wafer is diced. The portions trimmed from the edges of the wafer can have widths of about 1 mm to about 5 mm, for example. Further, as shown in FIGS. 6B and 6C, the two end solar cells 402 to be diced from a wafer can be oriented with their front surface bus bars (or discrete contact pads) 500 along their outside edges and thus along two of the edges of the wafer. Because in the super cells disclosed in this specification bus bars (or discrete contact pads) 500 are typically overlapped by an adjacent solar cell, low light conversion efficiency along those two edges of the wafer typically does not affect performance of the solar cells. Consequently, in some variations edges of a square or pseudo square wafer oriented parallel to the short sides of the rectangular solar cells are trimmed as just described, but edges of the wafer oriented parallel to the long sides of rectangular solar cells are not. In other variations, one, two, three, or four edges of a square wafer (e.g., wafer 606 in FIG. 6D) are trimmed as just described. In other variations, one, two, three, or four of the long edges of a pseudo-square wafer are trimmed as just described.

Solar cells having long and narrow aspect ratios and areas less than that of a standard 156 mm×156 mm solar cell, as illustrated, can be advantageously employed to reduce resistive power losses in the solar cell modules disclosed in this specification. In particular, the reduced area of solar cells 402 compared to standard size silicon solar cells decreases the current produced in the solar cell, directly reducing resistive power loss in the solar cell and in a series connected string of such solar cells. In addition, arranging such rectangular solar cells in a super cell 400 so that current flows through the super cell parallel to the short sides of the solar cells can reduce the distance that the current must flow through the semiconductor material to reach fingers 502 in the front surface metallization pattern and reduce the required length of the fingers, which can also reduce resistive power loss.

As noted above, bonding overlapped solar cells 402 to each other in their overlapping region to electrically connect the solar cells in series reduces the length of the electrical connection between adjacent solar cells, compared to conventionally tabbed series-connected strings of solar cells. This also reduces resistive power loss.

Referring again to FIG. 5, in the illustrated example the front surface metallization pattern on solar cell 402 includes an optional bypass conductor 504 running parallel to and spaced apart from bus bar 500. (Such a bypass conductor can also optionally be used in the metallization patterns shown in FIGS. 6B and 6D). Bypass conductor 504 interconnects fingers 502 to electrically bypass cracks that can form between bus bar 500 and bypass conductor 504. Such cracks, which can sever fingers 502 at locations near to bus bar 500, can otherwise isolate regions of solar cell 402 from bus bar 500. The bypass conductor provides an alternative electrical path between such severed fingers and the bus bar. The illustrated example illustrates a bypass conductor 504 positioned parallel to bus bar 500, extending about the full length of the bus bar, and interconnecting every finger 502. This arrangement may be preferred but is not required. If present, the bypass conductor need not run parallel to the bus bar and need not extend the full length of the bus bar. Further, a bypass conductor interconnects at least two fingers, but need not interconnect all fingers. Two or more short bypass conductors can be used in place of a longer bypass conductor, for example. Any suitable arrangement of bypass conductors can be used.

The example front surface metallization pattern of FIG. 5 also includes an optional end conductor 506 that interconnects fingers 502 at their far ends, opposite from bus bar 500. (Such an end conductor can also optionally be used in the metallization patterns shown in FIGS. 6B and 6D). The width of conductor 506 can be about the same as that of a finger 502, for example. Conductor 506 interconnects fingers 502 to electrically bypass cracks that can form between bypass conductor 504 and conductor 506, and thereby provides a current path to bus bar 500 for regions of solar cell 402 that might otherwise be electrically isolated by such cracks.

Although some of the illustrated examples illustrate a front bus bar 500 extending substantially the length of the long sides of solar cell 402 with uniform width, this is not required. For example, as alluded to above front bus bar 500 can be replaced by two or more front surface discrete contact pads 500 which can be arranged, for example, in line with each other along a side of solar cell 402 as shown in FIG. 6B, for example. Such discrete contact pads can optionally be interconnected by thinner conductors running between them, as shown for example in the figures just mentioned. In such variations, the width of the contact pads measured perpendicularly to the long side of the solar cell can be for example about 2 to about 20 times that of the thin conductors interconnecting the contact pads. There can be a separate (e.g., small) contact pad for each finger in the front surface metallization pattern, or each contact pad can be connected to two or more fingers. Front surface contact pads 500 can be square or have a rectangular shape elongated parallel to the edge of the solar cell, for example. Front surface contact pads 500 can have widths perpendicular to the long side of the solar cell of about 1 mm to about 1.5 mm, for example, and lengths parallel to the long side of the solar cell of about 1 mm to about 10 mm for example. The spacing between contact pads 500 measured parallel to the long side of the solar cell can be about 3 mm to about 30 mm, for example.

Alternatively, solar cell 402 can lack both a front bus bar 500 and discrete front contact pads 500 and include only fingers 502 in the front surface metallization pattern. In such variations, the current-collecting functions that would otherwise be performed by a front bus bar 500 or contact pads 500 can instead be performed, or partially performed, by the conductive material used to bond two solar cells 402 to each other in the overlapping configuration described above.

Solar cells lacking both a bus bar 500 and contact pads 500 can either include bypass conductor 504, or not include bypass conductor 504. If bus bar 500 and contact pads 500 are absent, bypass conductor 504 can be arranged to bypass cracks that form between the bypass conductor and the portion of the front surface metallization pattern that is conductively bonded to the overlapping solar cell.

The front surface metallization patterns, including bus bar or discrete contact pads 500, fingers 502, bypass conductor 504 (if present), and end conductor 506 (if present) can be formed, for example, from silver paste conventionally used for such purposes and deposited, for example, by conventional screen printing methods. Alternatively, the front surface metallization patterns can be formed from electroplated copper. Any other suitable materials and processes can be also used. In variations in which the front surface metallization pattern is formed from silver, the use of discrete front surface contact pads 500 rather than a continuous bus bar 500 along the edge of the cell reduces the amount of silver on the solar cell, which can advantageously reduce cost. In variations in which the front surface metallization pattern is formed from copper or from another conductor less expensive than silver, a continuous bus 500 can be employed without a cost disadvantage.

FIGS. 6C and 6E illustrate example back surface metallization patterns for a solar cell. In these examples the back surface metallization patterns include discrete back surface contact pads 602 arranged along one of the long edges of the back surface of the solar cell and a metal contact 604 covering substantially all of the remaining back surface of the solar cell. In a shingled super cell, contact pads 602 are bonded for example to a bus bar or to discrete contact pads arranged along the edge of the upper surface of an adjacent overlapping solar cell to electrically connect the two solar cells in series. For example, each discrete back surface contact pad 602 can be aligned with and bonded to a corresponding discrete front surface contact pad 500 on the front surface of the overlapping solar cell by electrically conductive bonding material applied only to the discrete contact pads. Discrete contact pads 602 can be square or have a rectangular shape elongated parallel to the edge of the solar cell (e.g., FIGS. 6C and 6E), for example. Contact pads 602 can have widths perpendicular to the long side of the solar cell of about 1 mm to about 5 mm, for example, and lengths parallel to the long side of the solar cell of about 1 mm to about 10 mm for example. The spacing between contact pads 602 measured parallel to the long side of the solar cell can be about 3 mm to about 30 mm, for example.

Contact 604 can be formed, for example, from aluminum and/or electroplated copper. Formation of an aluminum back contact 604 typically provides a back surface field that reduces back surface recombination in the solar cell and thereby improves solar cell efficiency. If contact 604 is formed from copper rather than aluminum, contact 604 can be used in combination with another passivation scheme (e.g., aluminum oxide) to similarly reduce back surface recombination. Discrete contact pads 602 can be formed, for example, from silver paste. The use of discrete silver contact pads 602 rather than a continuous silver contact pad along the edge of the cell reduces the amount of silver in the back surface metallization pattern, which can advantageously reduce cost.

Further, if the solar cells rely on a back surface field provided by formation of an aluminum contact to reduce back surface recombination, the use of discrete silver contacts rather than a continuous silver contact can improve solar cell efficiency. This is because the silver back surface contacts do not provide a back surface field and therefore tend to promote carrier recombination and produce dead (inactive) volumes in the solar cells above the silver contacts. In conventionally ribbon-tabbed solar cell strings those dead volumes are typically shaded by ribbons and/or bus bars on the front surface of the solar cell, and thus do not result in any extra loss of efficiency. In the solar cells and super cells disclosed herein, however, the volume of the solar cell above back surface silver contact pads 602 is typically unshaded by any front surface metallization, and any dead volumes resulting from use of silver back surface metallization reduce the efficiency of the cell. The use of discrete silver contact pads 602 rather than a continuous silver contact pad along the edge of the back surface of the solar cell thus reduces the volume of any corresponding dead zones and increases the efficiency of the solar cell.

Although the particular example solar cells shown in the figures are described as having particular combinations of front and back surface metallization patterns, more generally any suitable combination of front and back surface metallization patterns can be used. For example, one suitable combination can employ a silver front surface metallization pattern including discrete contact pads 500, fingers 502, and an optional bypass conductor 504, and a back surface metallization pattern including an aluminum contact 604 and discrete silver contact pads 602. Another suitable combination can employ a copper front surface metallization pattern including a continuous bus bar 500, fingers 502, and an optional bypass conductor 504, and a back surface metallization pattern including a continuous bus bar 602 and a copper contact 604. More generally, solar cells 402 can employ any suitable front and back surface metallization patterns.

Figure 7:
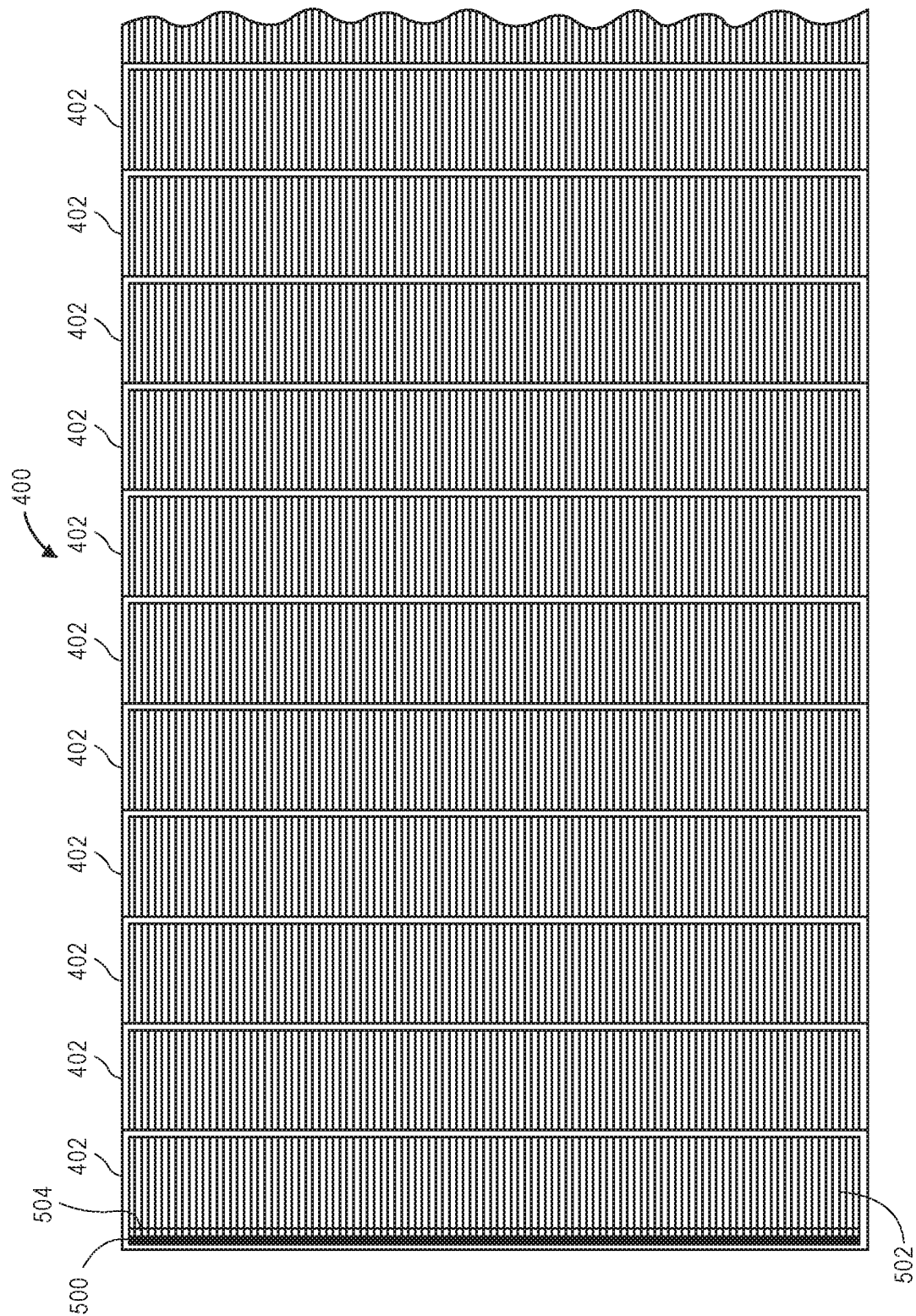
FIG. 7 illustrates a fragmentary view of the front surface of an example rectangular super cell including rectangular solar cells as shown for example in FIG. 5 arranged in a shingled manner as shown in FIG. 4, in accordance with an embodiment of the present disclosure.

FIG. 7 illustrates a portion of the front surface of an example rectangular super cell 400 including solar cells 402 as shown in FIG. 5 arranged in a shingled manner as shown in FIG. 4. As a result of the shingling geometry, there is no physical gap between pairs of solar cells 402. In addition, although bus bar 500 of the solar cell 402 at one end of super cell 400 is visible, the bus bars (or front surface contact pads) of the other solar cells are hidden beneath overlapping portions of adjacent solar cells. As a consequence, super cell 400 efficiently uses the area it takes up in a solar module. In particular, a larger portion of that area is available to produce electricity than is the case for conventionally tabbed solar cell arrangements and solar cell arrangements including numerous visible bus bars on the illuminated surface of the solar cells.

In the example illustrated in FIG. 7, bypass conductors 504 are hidden by overlapping portions of adjacent cells. Alternatively, solar cells including bypass conductors 504 can be overlapped similarly to as shown in FIG. 7 without covering the bypass conductors.

The exposed front surface bus bar 500 at one end of super cell 400 and the back surface metallization of the solar cell at the other end of super cell 400 provide negative and positive (terminal) end contacts for the super cell that can be used to electrically connect super cell 400 to other super cells and/or to other electrical components as desired.

Adjacent solar cells in super cell 400 can overlap by any suitable amount, for example by about 1 millimeter (mm) to about 5 mm.

As shown in FIGS. 8A-8D, for example, shingled super cells as just described can efficiently fill the area of a solar module. Such solar modules can be square or rectangular, for example. Rectangular solar modules as illustrated in FIGS. 8A-8D can have shorts sides having a length, for example, of about 1 meter and long sides having a length, for example, of about 1.5 to about 2.0 meters. Any other suitable shapes and dimensions for the solar modules can also be used. Any suitable arrangement of super cells in a solar module can be used.

In a square or rectangular solar module, the super cells are typically arranged in rows parallel to the short or long sides of the solar module. Each row can include one, two, or more super cells arranged end-to-end. A super cell 400 forming part of such a solar module can include any suitable number of solar cells 402 and be of any suitable length. In some variations super cells 400 each have a length approximately equal to the length of the short sides of a rectangular solar module of which they are a part. In other variations super cells 400 each have a length approximately equal to one half the length of the short sides of a rectangular solar module of which they are a part. In other variations super cells 400 each have a length approximately equal to the length of the long sides of a rectangular solar module of which they are a part. In other variations super cells 400 each have a length approximately equal to one half the length of the long sides of a rectangular solar module of which they are a part. The number of solar cells required to make super cells of these lengths depends of course on the dimensions of the solar module, the dimensions of the solar cells, and the amount by which adjacent solar cells overlap. Any other suitable lengths for super cells can also be used.

In variations in which a super cell 400 has a length approximately equal to the length of the short sides of a rectangular solar module, the super cell can include, for example, 56 rectangular solar cells having dimensions of about 19.5 millimeters (mm) by about 156 mm, with adjacent solar cells overlapped by about 3 mm. Eight such rectangular solar cells can be separated from a conventional square or pseudo square 156 mm wafer. Alternatively such a super cell can include, for example, 38 rectangular solar cells having dimensions of about 26 mm by about 156 mm, with adjacent solar cells overlapped by about 2 mm. Six such rectangular solar cells can be separated from a conventional square or pseudo square 156 mm wafer. In variations in which a super cell 400 has a length approximately equal to half the length of the short sides of a rectangular solar module, the super cell can include, for example, 28 rectangular solar cells having dimensions of about 19.5 millimeters (mm) by about 156 mm, with adjacent solar cells overlapped by about 3 mm. Alternatively, such a super cell can include, for example, 19 rectangular solar cells having dimensions of about 26 mm by about 156 mm, with adjacent solar cells overlapped by about 2 mm.

In variations in which a super cell 400 has a length approximately equal to the length of the long sides of a rectangular solar module, the super cell can include, for example, 72 rectangular solar cells having dimensions of about 26 mm by about 156 mm, with adjacent solar cells overlapped by about 2 mm. In variations in which a super cell 400 has a length approximately equal to one half the length of the long sides of a rectangular solar module, the super cell can include, for example, 36 rectangular solar cells having dimensions of about 26 mm by about 156 mm, with adjacent solar cells overlapped by about 2 mm.

Figure 8B:
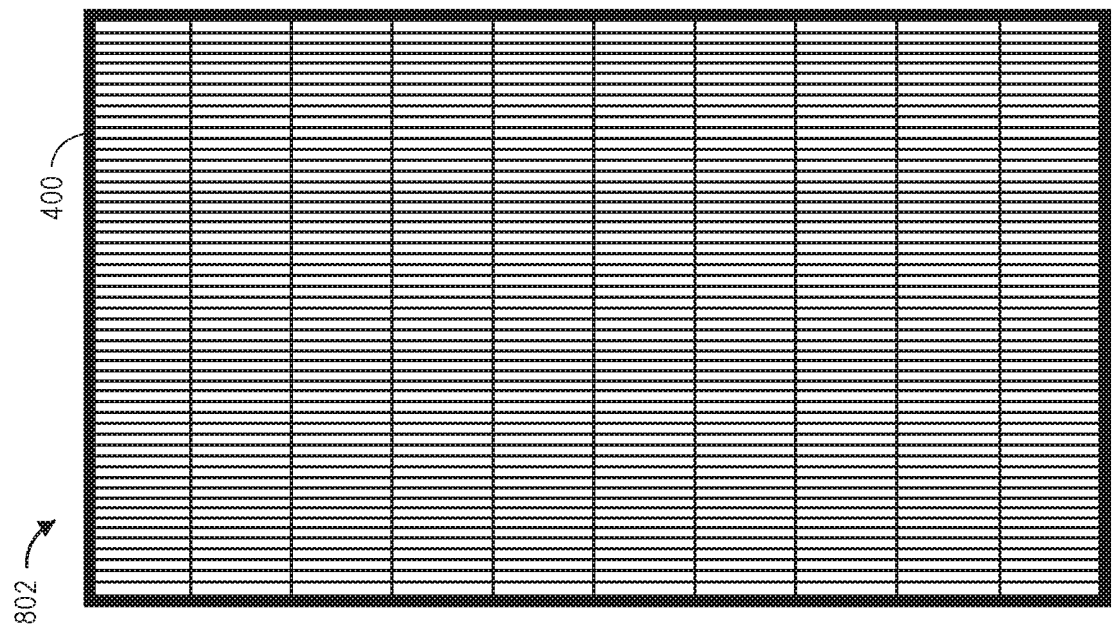
FIG. 8B illustrates a diagram of another example rectangular solar module including a plurality of rectangular shingled super cells, with the long side of each super cell having a length of approximately the length of the short sides of the module. The super cells are arranged with their long sides parallel to the short sides of the module, in accordance with an embodiment of the present disclosure.
Figure 8A:
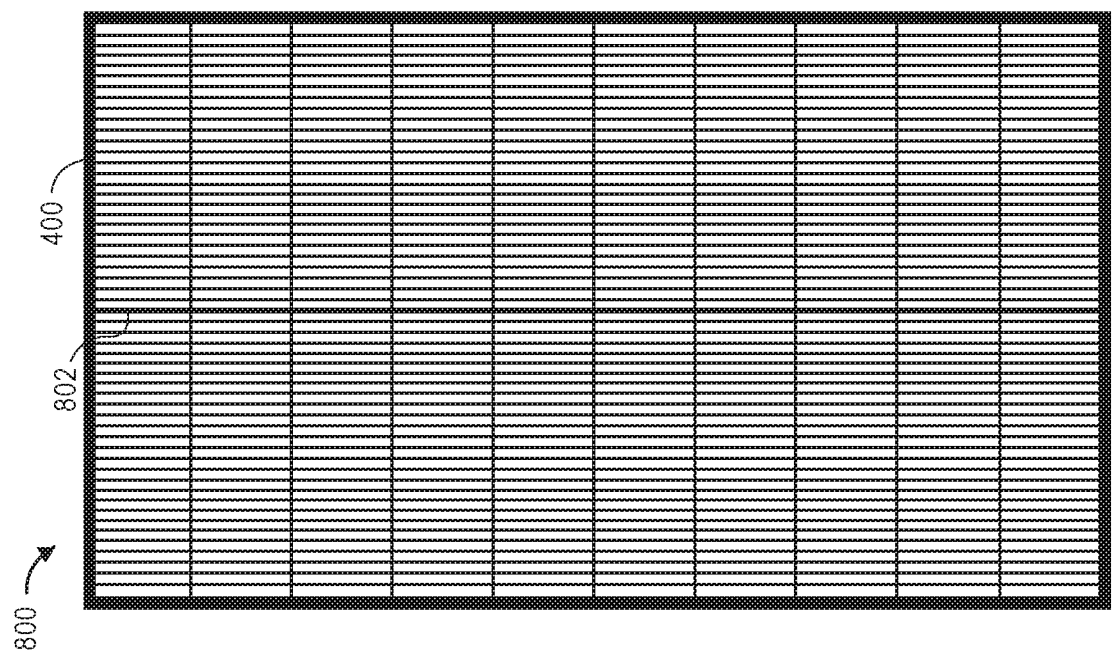
FIG. 8A illustrates a diagram of an example rectangular solar module including a plurality of rectangular shingled super cells, with the long side of each super cell having a length of approximately half the length of the short sides of the module. Pairs of the super cells are arranged end-to-end to form rows with the long sides of the super cells parallel to the short sides of the module, in accordance with an embodiment of the present disclosure.

FIG. 8A illustrates an example rectangular solar module 800 including twenty rectangular super cells 400, each of which has a length approximately equal to one half the length of the short sides of the solar module. The super cells are arranged end-to-end in pairs to form ten rows of super cells, with the rows and the long sides of the super cells oriented parallel to the short sides of the solar module. In other variations, each row of super cells can include three or more super cells. Also, a similarly configured solar module can include more or fewer rows of super cells than shown in this example.

It is to be appreciated that a gap can facilitate making electrical contact to front surface end contacts of super cells 400 along the center line of the solar module, in variations in which the super cells in each row are arranged so that at least one of them has a front surface end contact on the end of the super cell adjacent to the other super cell in the row. For example, the two super cells in a row can be arranged with one super cell having its front surface terminal contact along the center line of the solar module and the other super cell having its back surface terminal contact along the center line of the solar module. In such an arrangement the two super cells in a row can be electrically connected in series by an interconnect arranged along the center line of the solar module and bonded to the front surface terminal contact of one super cell and to the back surface terminal contact of the other super cell. (See e.g. FIG. 10C discussed below). In variations in which each row of super cells includes three or more super cells, additional gaps between super cells can be present and can similarly facilitate making electrical contact to front surface end contacts that are located away from the sides of the solar module.

FIG. 8B illustrates an example rectangular solar module 803 including ten rectangular super cells 400, each of which has a length approximately equal to the length of the short sides of the solar module. The super cells are arranged as ten parallel rows with their long sides oriented parallel to the short sides of the module. A similarly configured solar module can include more or fewer rows of such side-length super cells than shown in this example.

FIG. 8B also illustrates what solar module 800 of FIG. 8A looks like when there are no gaps between adjacent super cells in the rows of super cells in solar module 800. It is to be appreciated that use of a gap can be eliminated, for example, by arranging the super cells so that both super cells in each row have their back surface end contacts along the center line of the module. In this case the super cells can be arranged nearly abutting each other with little or no extra gap between them because no access to the front surface of the super cell is required along the center of the module. Alternatively, two super cells 400 in a row can be arranged with one having its front surface end contact along a side of the module and its back surface end contact along the center line of the module, the other having its front surface end contact along the center line of the module and its back surface end contact along the opposite side of the module, and the adjacent ends of the super cells overlapping. A flexible interconnect can be sandwiched between the overlapping ends of the super cells, without shading any portion of the front surface of the solar module, to provide an electrical connection to the front surface end contact of one of the super cells and the back surface end contact of the other super cell. For rows containing three or more super cells these two approaches can be used in combination.

The super cells and rows of super cells shown in FIGS. 8A and 8B can be interconnected by any suitable combination of series and parallel electrical connections. The interconnections between super cells can be made, for example, using flexible interconnects similarly to as described below with respect to FIGS. 8C and 8D.

Figure 8D:
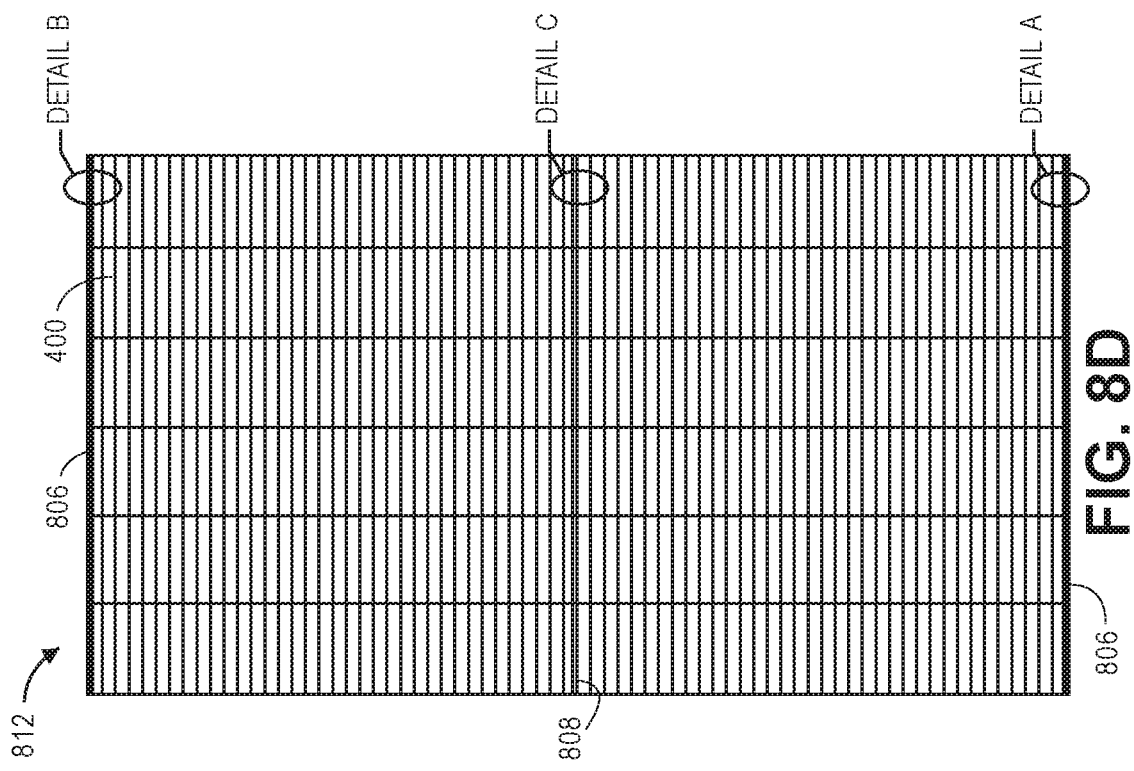
FIG. 8D illustrates a diagram of an example rectangular solar module including a plurality of rectangular shingled super cells, with the long side of each super cell having a length of approximately half the length of the long sides of the module. Pairs of the super cells are arranged end-to-end to form rows with the long sides of the super cells parallel to the long sides of the module, in accordance with an embodiment of the present disclosure.
Figure 8C:
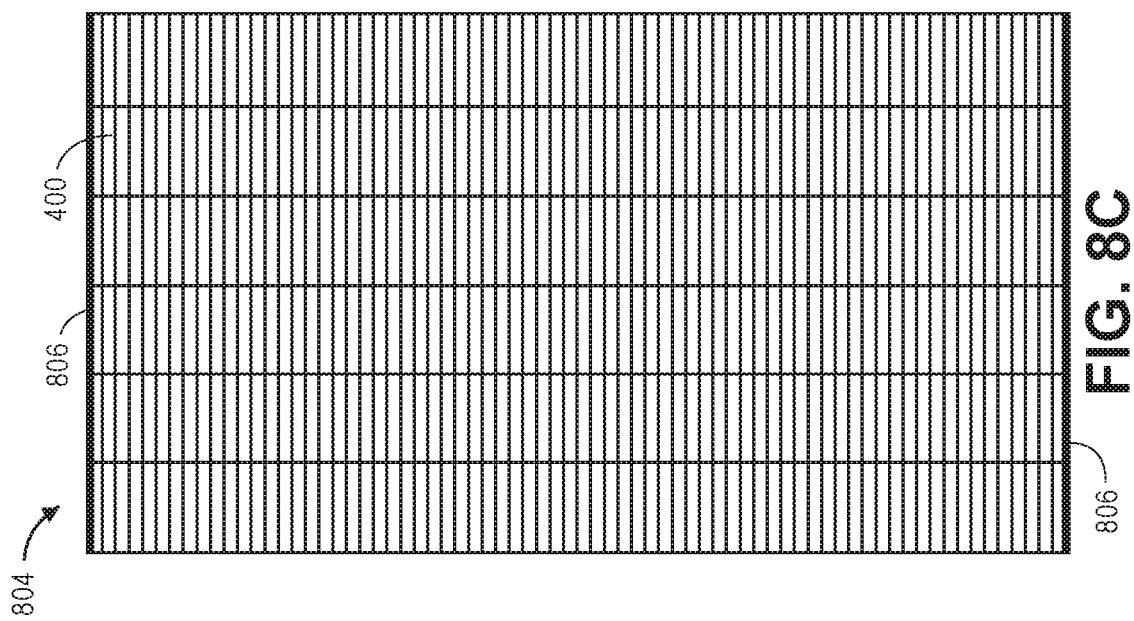
FIG. 8C illustrates a diagram of another example rectangular solar module including a plurality of rectangular shingled super cells, with the long side of each super cell having a length of approximately the length of the long side of the module. The super cells are arranged with their long sides parallel to the sides of the module, in accordance with an embodiment of the present disclosure.

FIG. 8C illustrates an example rectangular solar module 804 including six rectangular super cells 400, each of which has a length approximately equal to the length of the long sides of the solar module. The super cells are arranged as six parallel rows with their long sides oriented parallel to the long sides of the module. A similarly configured solar module can include more or fewer rows of such side-length super cells than shown in this example. Each super cell in this example (and in several of the following examples) includes 72 rectangular solar cells each having a width approximately equal to ⅙ the width of a 156 mm square or pseudo square wafer. Any other suitable number of rectangular solar cells of any other suitable dimensions can also be used. In this example the front surface terminal contacts of the super cells are electrically connected to each other with flexible interconnects 806 positioned adjacent to and running parallel to the edge of one short side of the module. The back surface terminal contacts of the super cells are similarly connected to each other by flexible interconnects positioned adjacent to and running parallel to the edge of the other short side, behind the solar module. The back surface interconnects are hidden from view in FIG. 8C. This arrangement electrically connects the six module-length super cells in parallel.

FIG. 8D illustrates an example rectangular solar module 812 including twelve rectangular super cells 400, each of which has a length approximately equal to one half the length of the long sides of the solar module. The super cells are arranged end-to-end in pairs to form six rows of super cells, with the rows and the long sides of the super cells oriented parallel to the long sides of the solar module. In other variations, each row of super cells can include three or more super cells. Also, a similarly configured solar module can include more or fewer rows of super cells than shown in this example. Each super cell in this example (and in several of the following examples) includes 36 rectangular solar cells each having a width approximately equal to ⅙ the width of a 156 mm square or pseudo square wafer. Any other suitable number of rectangular solar cells of any other suitable dimensions can also be used. It is to be appreciated that a gap can be used to facilitate making electrical contact to front surface end contacts of super cells 400 along the center line of the solar module. In this example, flexible interconnects 806 positioned adjacent to and running parallel to the edge of one short side of the module electrically interconnect the front surface terminal contacts of six of the super cells. Similarly, flexible interconnects positioned adjacent to and running parallel to the edge of the other short side of the module behind the module electrically connect the back surface terminal contacts of the other six super cells. Flexible interconnects (not shown in this figure) can be positioned along a gap of each pair of super cells in a row in series and, optionally, extend laterally to interconnect adjacent rows in parallel. This arrangement electrically connects the six rows of super cells in parallel. Optionally, in a first group of super cells the first super cell in each row is electrically connected in parallel with the first super cell in each of the other rows, in a second group of super cells the second super cell is electrically connected in parallel with the second super cell in each of the other rows, and the two groups of super cells are electrically connect in series. The later arrangement allows each of the two groups of super cells to be individually put in parallel with a bypass diode.

Detail A in FIG. 8D identifies the location of a cross-sectional view shown in FIG. 10A of the interconnection of the back surface terminal contacts of super cells along the edge of one short side of the module. Detail B similarly identifies the location of a cross-sectional view shown in FIG. 10B of the interconnection of the front surface terminal contacts of super cells along the edge of the other short side of the module. Detail C identifies the location of a cross-sectional view shown in FIG. 10C of series interconnection of the super cells within a row along a gap 808.

In other examples, half-cut solar cells are used for fabrication of a solar cell module. FIG. 8E illustrates a plan view of a solar cell module including half-cut cells, and FIG. 8F illustrates an enlarged view of a portion of the solar cell module of FIG. 8E, in accordance with an embodiment of the present disclosure.

Figure 8F:
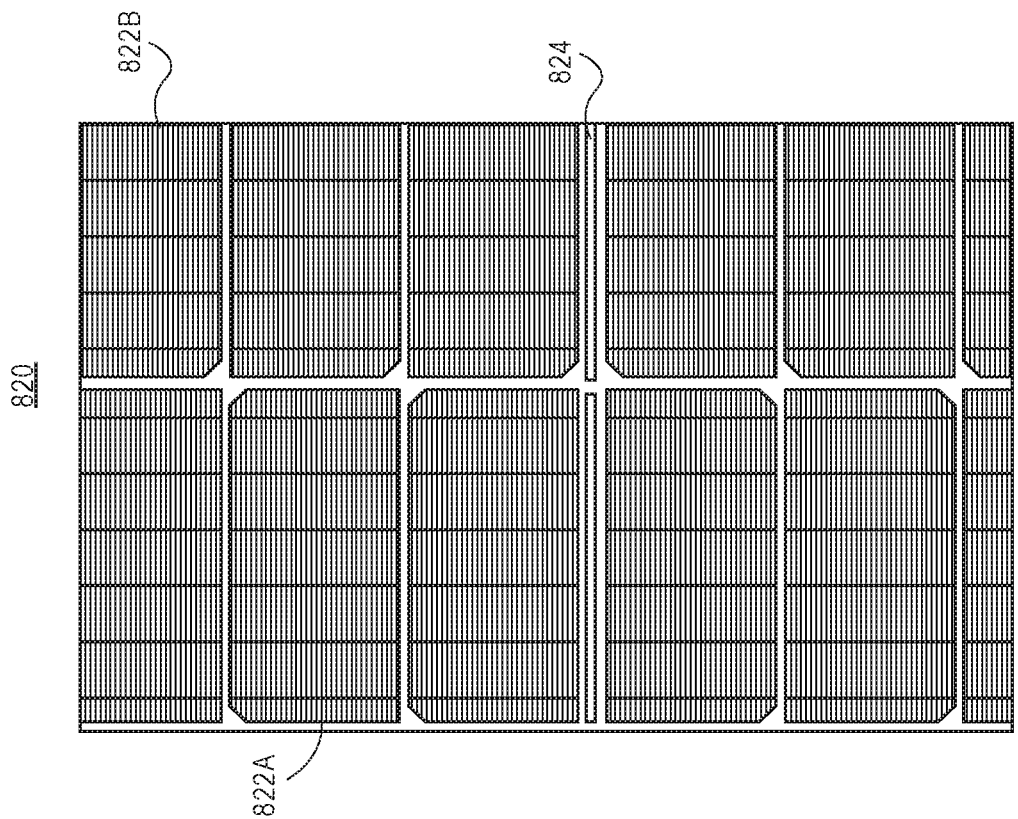
FIG. 8F illustrates an enlarged view of a portion of the solar cell module of FIG. 8E, in accordance with an embodiment of the present disclosure.
Figure 8E:
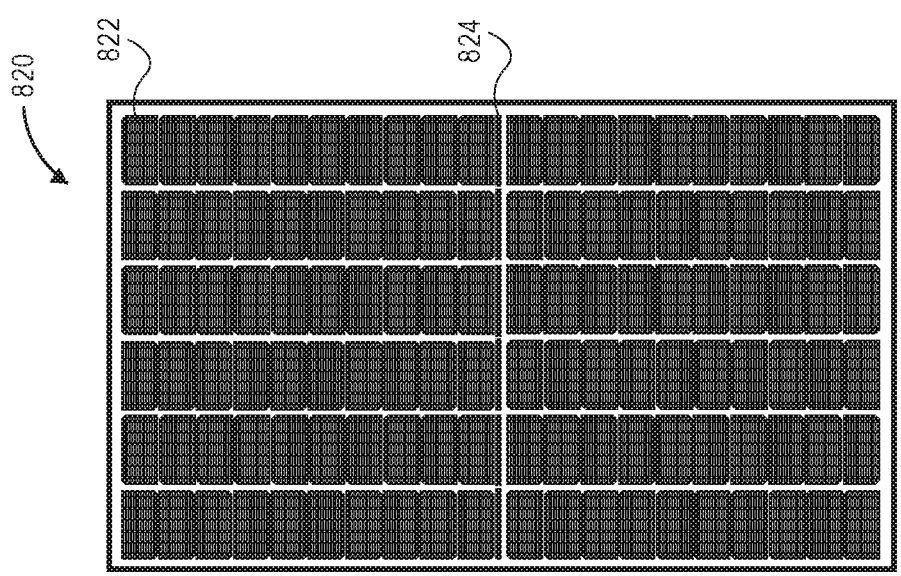
FIG. 8E illustrates a plan view of a solar cell module including half-cut cells, in accordance with an embodiment of the present disclosure.

Referring to FIGS. 8E and 8F, a module 820 includes half-cut solar cells 822. In one embodiment, the cells are arranged in alternating columns of upward half-cut cells 822A and downward half-cut cells 822B, as is depicted in FIG. 8F. A centerline 824 can be included in the arrangement of module 820, as is depicted in FIG. 8E. In other embodiments, such a centerline is not included.

Figure 8I:
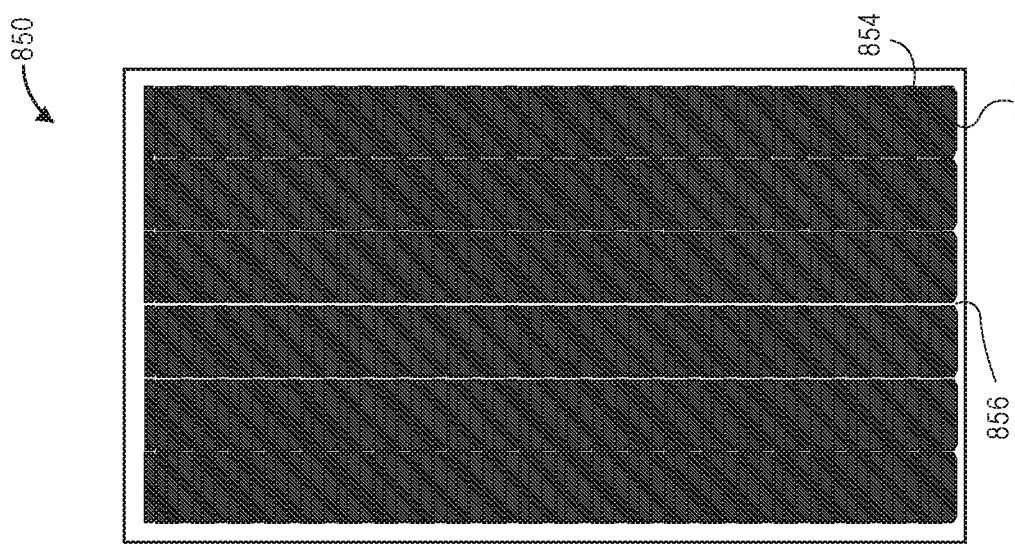
FIG. 8I illustrates a plan view of a solar cell module including a vertical layup with shingled cells and centerline arrangement, in accordance with an embodiment of the present disclosure.

It is to be appreciated that other shingled module arrangements can be fabricated. As an example, FIG. 8G illustrates a plan view of a solar cell module including a vertical shingled layup with rectangular strips arrangement, in accordance with an embodiment of the present disclosure. Referring to FIG. 8G, a module 830 includes vertical strips 832 of rectangular solar cells 834.

Figure 8H:
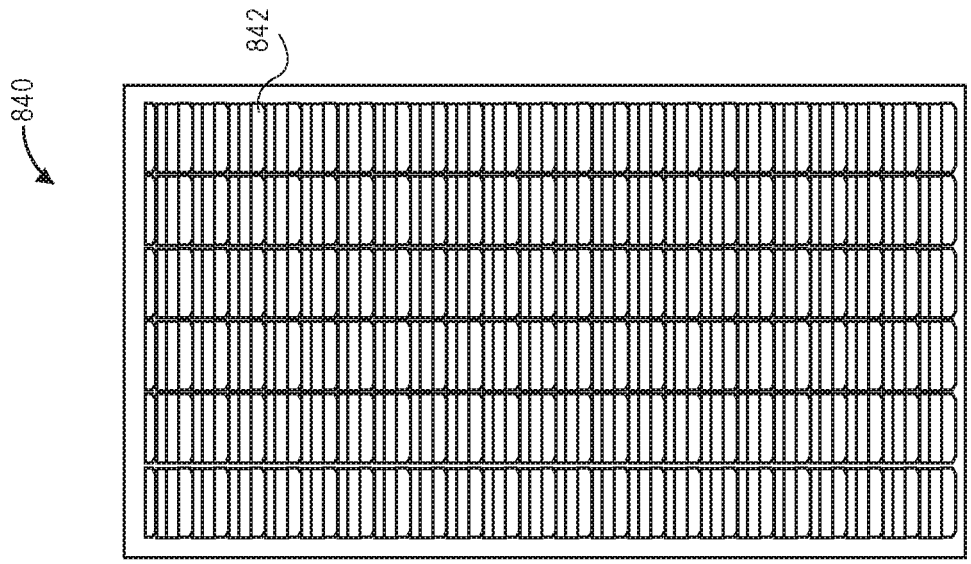
FIG. 8H illustrates a plan view of a solar cell module including a vertical layup with shingled chamfered cells arrangement, in accordance with an embodiment of the present disclosure.
Figure 8G:
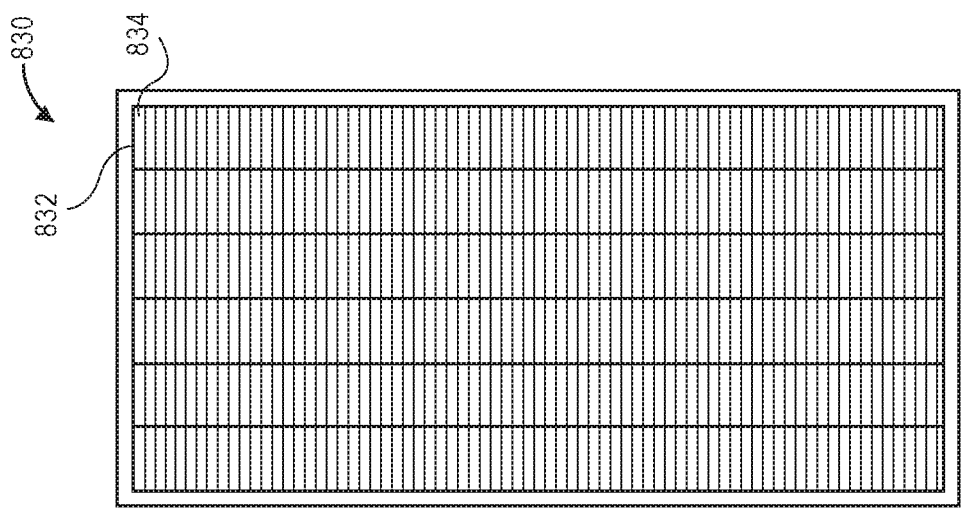
FIG. 8G illustrates a plan view of a solar cell module including a vertical shingled layup with rectangular strips arrangement, in accordance with an embodiment of the present disclosure.

As another example, FIG. 8H illustrates a plan view of a solar cell module including a vertical layup with shingled chamfered cells arrangement, in accordance with an embodiment of the present disclosure. Referring to FIG. 8H, a module 840 includes vertical strips of chamfered solar cells 842.

As another example, FIG. 8I illustrates a plan view of a solar cell module including a vertical layup with shingled cells and centerline arrangement, in accordance with an embodiment of the present disclosure. Referring to FIG. 8I, a module 850 includes vertical strips 852 of chamfered solar cells 854. In other embodiments, rectangular cells are used. A centerline 856 can be included in the arrangement of module 850, as is depicted. In other embodiments, such a centerline is not included.

Figure 9:
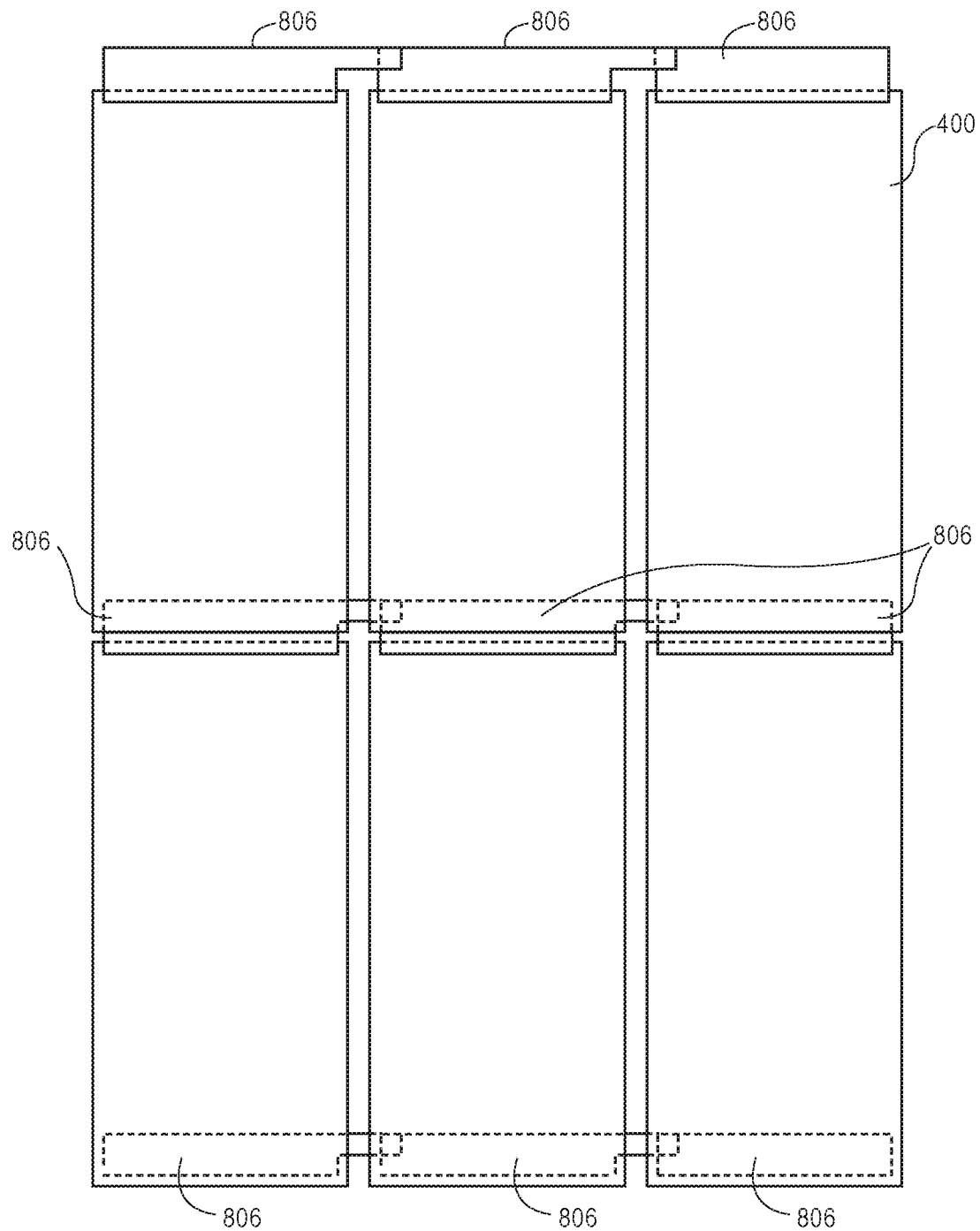
FIG. 9 illustrates an example arrangement of three rows of super cells interconnected with flexible electrical interconnects to put the super cells within each row in series with each other, and to put the rows in parallel with each other. These can be three rows in the solar module of FIG. 8D, for example, in accordance with an embodiment of the present disclosure.

FIG. 9 illustrates in more detail than FIGS. 8C and 8D an example arrangement of three rows of super cells interconnected with flexible electrical interconnects to put the super cells within each row in series with each other, and to put the rows in parallel with each other. These can be three rows in the solar module of FIG. 8D, for example. In the example of FIG. 9, each super cell 400 has a flexible interconnect 806 conductively bonded to its front surface terminal contact, and another flexible interconnect conductively bonded to its back surface terminal contact. The two super cells within each row are electrically connected in series by a shared flexible interconnect conductively bonded to the front surface terminal contact of one super cell and to the back surface terminal contact of the other super cell. Each flexible interconnect is positioned adjacent to and runs parallel to an end of a super cell to which it is bonded, and can extend laterally beyond the super cell to be conductively bonded to a flexible interconnect on a super cell in an adjacent row, electrically connecting the adjacent rows in parallel. Dotted lines in FIG. 9 depict portions of the flexible interconnects that are hidden from view by overlying portions of the super cells, or portions of the super cells that are hidden from view by overlying portions of the flexible interconnects.

Flexible interconnects 806 can be conductively bonded to the super cells with, for example, a mechanically compliant electrically conductive bonding material as described above for use in bonding overlapped solar cells. Optionally, the electrically conductive bonding material can be located only at discrete positions along the edges of the super cell rather than in a continuous line extending substantially the length of the edge of the super cell, to reduce or accommodate stress parallel to the edges of the super cell arising from mismatch between the coefficient of thermal expansion of the electrically conductive bonding material or the interconnects and that of the super cell.

Flexible interconnects 806 can be formed from or include thin copper sheets, for example. Flexible interconnects 806 can be optionally patterned or otherwise configured to increase their mechanical compliance (flexibility) both perpendicular to and parallel to the edges of the super cells to reduce or accommodate stress perpendicular and parallel to the edges of the super cells arising from mismatch between the CTE of the interconnect and that of the super cells. Such patterning can include, for example, slits, slots, or holes. Conductive portions of interconnects 806 can have a thickness of, for example, less than about 100 microns, less than about 50 microns, less than about 30 microns, or less than about 25 microns to increase the flexibility of the interconnects. The mechanical compliance of the flexible interconnect, and its bonds to the super cells, should be sufficient for the interconnected super cells to survive stress arising from CTE mismatch during the lamination process described in more detail below with respect to methods of manufacturing shingled solar cell modules, and to survive stress arising from CTE mismatch during temperature cycling testing between about −40° C. and about 85° C. Preferably, flexible interconnects 806 exhibit a resistance to current flow parallel to the ends of the super cells to which they are bonded of less than or equal to about 0.015 Ohms, less than or equal to about 0.012 Ohms, or less than or equal to about 0.01 Ohms.

As shown in the cross-sectional views of FIGS. 10A-10C, for example, the solar modules described in this specification typically include a laminate structure with super cells and one or more encapsulant materials 808 sandwiched between a transparent front sheet 1000 and a back sheet 1002. The transparent front sheet can be glass, for example. Optionally, the back sheet can also be transparent, which can allow bifacial operation of the solar module. The back sheet can be a polymer sheet, for example. Alternatively, the solar module can be a glass-glass module with both the front and back sheets glass.

The cross-sectional view of FIG. 10A (detail A from FIG. 8D) illustrates an example of a flexible interconnect 806 conductively bonded to a back surface terminal contact of a super cell near the edge of the solar module and extending inward beneath the super cell, hidden from view from the front of the solar module. An extra strip of encapsulant 1004 can be disposed between interconnect 806 and the back surface of the super cell, as illustrated. A glued or soldered joint 1006 can also be includes, as is depicted.

The cross-sectional view of FIG. 10B (Detail B from FIG. 8B) illustrates an example of a flexible interconnect 806 conductively bonded to a front surface terminal contact of a super cell. A glued or soldered joint 1008 can also be includes, as is depicted.

The cross-sectional view of FIG. 10C (Detail C from FIG. 8B) illustrates an example of a shared flexible interconnect 806 conductively bonded to the front surface terminal contact of one super cell and to the back surface terminal contact of the other super cell to electrically connect the two super cells in series. An optional black film or coating 1014 can be included on the interconnect. A glued or soldered joint 1010 and/or 1012 can also be included, as is depicted.

Figure 11:
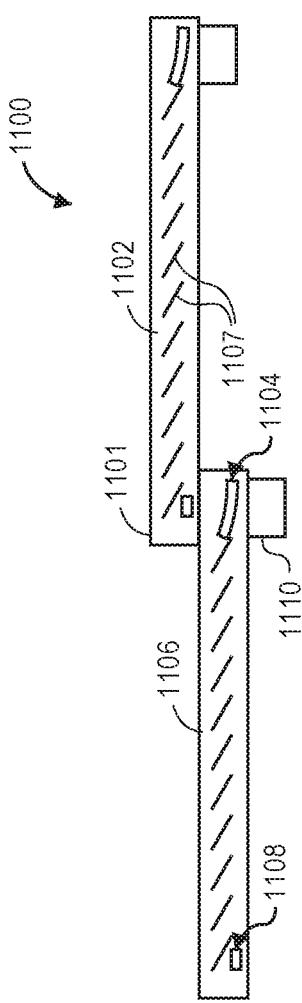
FIGS. 11 and 12 illustrate simplified cross-sectional views of arrays including a plurality of modules assembled in shingled configurations, in accordance with an embodiment of the present disclosure.

According to embodiments the modules themselves can be shingled, such that the top ribbon is covered by the neighboring module. FIG. 11 illustrates a simplified cross-sectional view of such an arrangement 1100, where an end portion 1101 of an adjacent module 1102, serves to overlap the top ribbon 1104 of an instant module 1106. Each module itself includes a plurality of shingled solar cells 1107. The bottom ribbon 1108 of the instant module 1106 is buried. It is located on an elevated side of the instant shingled module in order to overlap the next adjacent shingled module. This shingled module configuration could also provide for additional area on the module for other elements, without adversely impacting a final exposed area of the module array. Examples of module elements that can be positioned in overlapping regions can include but are not limited to, junction boxes (j-boxes) 1110 and/or bus ribbons.

Figure 12:
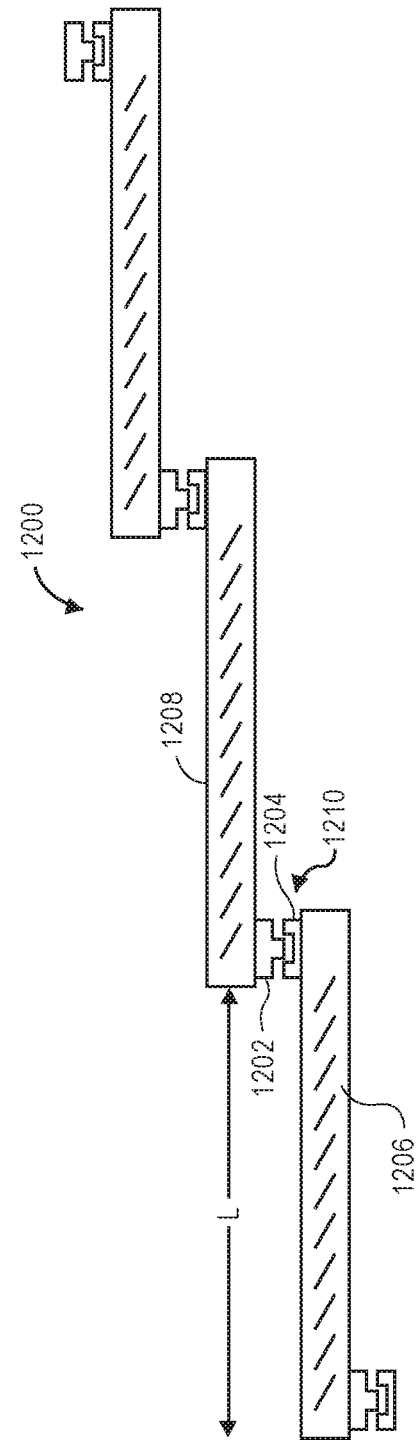

FIG. 12 illustrates another embodiment of a shingled module configuration 1200. Here, j-boxes 1202, 1204 of the respective adjacent shingled modules 1206 and 1208 are in a mating arrangement 1210 in order to achieve electrical connection between them. This simplifies the configuration of the array of shingled modules by eliminating wiring. In certain embodiments, the j-boxes could be reinforced and/or combined with additional structural standoffs. Such a configuration could create an integrated tilted module roof mount rack solution, wherein a dimension of the junction box determines a tilt. Such an implementation can be particularly useful where an array of shingled modules is mounted on a flat roof. Where the modules include a glass substrate and a glass cover (glass-glass modules), the modules could be used without additional frame members by shortening an overall module length (and hence an exposed length L resulting from the shingling). Such shortening would allow the modules of the tiled array to survive expected physical loads (e.g., a 5400 Pa snow load limit), without fracturing under the strain.

It is to be appreciated that the use of super cell structures including a plurality of individual solar cells assembled in a shingled manner can readily accommodate changing the length of the module to meet a specific length dictated by physical load and other requirements.

It is also to be appreciated that one or more processes described above can be implemented to fabricate a solar cell. The above described processes can be implemented in their entirety or portions of the one or more processes described above can be implemented to fabricate a solar cell. Although front-contact solar cells are described in great detail above, it is to be appreciated that interdigitated back contact (IBC) solar cell manufacturing processes can also benefit from implementing embodiments disclosed herein.

Although certain materials are described specifically with reference to above described embodiments, some materials can be readily substituted with others with such embodiments remaining within the spirit and scope of embodiments of the present disclosure. For example, in an embodiment, a different material substrate, such as a group III-V material substrate, can be used instead of a silicon substrate. Furthermore, it is to be appreciated that, where the ordering of P+ and then N+ type doping is described specifically for emitter regions on a back surface of a solar cell, other embodiments contemplated include the opposite ordering of conductivity type, i.e., N+ and then P+ type doping, respectively. In other embodiments, a P--type doped substrate is used in place of an N-type doped substrate. In other embodiments, the above described approaches can be applicable to manufacturing of other than solar cells. For example, manufacturing of light emitting diode (LEDs) can benefit from approaches described herein.

Thus, methods of fabricating solar cells having junctions retracted from cleaved edges, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims can be formulated during prosecution of the present application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

The following examples pertain to further embodiments. The various features of the different embodiments can be variously combined with some features included and others excluded to suit a variety of different applications.

Example embodiment 1: A solar cell includes a substrate having a light-receiving surface, a back surface, and sidewalls. An emitter region is in the substrate at the light-receiving surface of the substrate, the emitter region having sidewalls laterally retracted from the sidewalls of the substrate. A passivation layer is on the sidewalls of the emitter region.

Example embodiment 2: The solar cell of example embodiment 1, wherein the passivation layer is in a corresponding recess between a corresponding sidewall of the emitter region and a corresponding sidewall of the substrate.

Example embodiment 3: The solar cell of example embodiment 2, wherein a corresponding edge of the passivation layer is vertically aligned with the corresponding sidewall of the substrate.

Example embodiment 4: The solar cell of example embodiment 1, wherein the passivation layer is in a corresponding trench between a corresponding sidewall of the emitter region and a corresponding sidewall of the substrate.

Example embodiment 5: The solar cell of example embodiment 1, 2, 3 or 4, further including a passivation layer on the light-receiving surface of the substrate, wherein the passivation layer on the sidewalls of the emitter region is continuous with the passivation layer on the light-receiving surface of the substrate.

Example embodiment 6: The solar cell of example embodiment 5, wherein the passivation layer on the light-receiving surface of the substrate and the passivation layer on the sidewalls of the emitter region include silicon oxide (SiOx) and silicon nitride (SiNx).

Example embodiment 7: The solar cell of example embodiment 1, 2, 3, 4, 5 or 6, wherein the emitter region includes a concentration of dopants of a conductivity type, the solar cell further including regions of dopants of the conductivity type within the emitter region, the regions of dopants of the conductivity type having a higher concentration of dopants of the conductivity type than the concentration of dopants of the conductivity type of the emitter region.

Example embodiment 8: The solar cell of example embodiment 7, wherein the conductivity type is n-type, and the dopants are selected from the group consisting of phosphorous dopants and arsenic dopants.

Example embodiment 9: The solar cell of example embodiment 7 or 8, further including conductive contacts electrically connected to the regions of dopants of the conductivity type within the emitter region.

Example embodiment 10: The solar cell of example embodiment 9, wherein the conductive contacts are screen printed and fired through a passivation layer on the light-receiving surface of the substrate.

Example embodiment 11: The solar cell of example embodiment 9 or 10, wherein the conductive contacts include silver.

Example embodiment 12: The solar cell of example embodiment 1, 2, 3, 4, 5, 6, 7, 8, 9, 10 or 11, wherein the substrate is a p-type monocrystalline silicon substrate.

Example embodiment 13: The solar cell of example embodiment 1, 2, 3, 4, 5, 6, 7, 8, 9, 10, 11 or 12, wherein the emitter region includes n-type dopants, the solar cell further including regions of p-type dopants at the back surface of the substrate.

Example embodiment 14: The solar cell of example embodiment 13, further including a conductive contact electrically connected to the regions of p-type dopants at the back surface of the substrate.

Example embodiment 15: The solar cell of example embodiment 14, wherein the conductive contact is disposed through openings in a bottom passivation and capping layer on the back surface of the substrate.

Example embodiment 16: A method of fabricating a solar cell includes forming an emitter region in a substrate, at a light-receiving surface of the substrate. The method also includes forming a trench in the emitter region. The method also includes forming a passivation layer on the light-receiving surface of the substrate and in the trench to passivate an emitter edge. The method also includes cleaving the substrate to form a solar cell having sidewalls and an emitter region having sidewalls laterally retracted from the sidewalls of the solar cell.

Example embodiment 17: The method of example embodiment 16, wherein cleaving the substrate includes cleaving through the passivation layer in the trench.

Example embodiment 18: The method of example embodiment 16, wherein cleaving substrate includes cleaving through a portion of the emitter region laterally adjacent the trench.

Example embodiment 19: The method of example embodiment 16, 17 or 18, wherein the trench is formed using laser ablation.

Example embodiment 20: The method of example embodiment 16, 17 or 18, wherein the trench is formed using an etch paste delivered by screen print or inkjet.

What is claimed is:

1. A solar cell, comprising:
a substrate having a light-receiving surface, a back surface, and outer sidewalls;
an emitter region on the substrate at the light-receiving surface of the substrate, the emitter region having outer sidewalls laterally spaced inward from the outer sidewalls of the substrate at locations where the outer sidewalls of the substrate meet the light-receiving surface of the substrate; and
a passivation layer on the outer sidewalls of the emitter region, wherein the passivation layer is in a recess between a corresponding outer sidewall of the emitter region and a corresponding outer sidewall of the substrate.

2. The solar cell of claim 1, wherein a corresponding edge of the passivation layer is vertically aligned with the corresponding outer sidewall of the substrate.

3. The solar cell of claim 1, further comprising:
a passivation layer on the light-receiving surface of the substrate, wherein the passivation layer on the outer sidewalls of the emitter region is continuous with the passivation layer on the light-receiving surface of the substrate.

4. The solar cell of claim 3, wherein the passivation layer on the light-receiving surface of the substrate and the passivation layer on the outer sidewalls of the emitter region comprise silicon oxide (SiOx) and silicon nitride (SiNx).

5. The solar cell of claim 1, wherein the emitter region comprises a concentration of dopants of a conductivity type, the solar cell further comprising:
regions within a perimeter of the emitter region, the regions having a higher concentration of dopants of the conductivity type than the concentration of dopants of the conductivity type of the emitter region.

6. The solar cell of claim 5, wherein the conductivity type is n-type, and the dopants are selected from the group consisting of phosphorous dopants and arsenic dopants.

7. The solar cell of claim 5, further comprising:
conductive contacts electrically connected to the regions within the perimeter of the emitter region.

8. The solar cell of claim 7, wherein the conductive contacts are screen printed and fired through a passivation layer on the light-receiving surface of the substrate.

9. The solar cell of claim 7, wherein the conductive contacts comprise silver.

10. The solar cell of claim 1, wherein the substrate is a p-type monocrystalline silicon substrate.

11. The solar cell of claim 1, wherein the emitter region comprises n-type dopants, the solar cell further comprising:
regions of p-type dopants at the back surface of the substrate.

12. The solar cell of claim 11, further comprising:
a conductive contact electrically connected to the regions of p-type dopants at the back surface of the substrate.

13. The solar cell of claim 12, wherein the conductive contact is disposed through openings in a bottom passivation and capping layer on the back surface of the substrate.

* * * * *